United States Patent [19]
Mori et al.

[11] Patent Number: 5,384,784
[45] Date of Patent: Jan. 24, 1995

[54] SEMICONDUCTOR MEMORY DEVICE COMPRISING A TEST CIRCUIT AND A METHOD OF OPERATION THEREOF

[75] Inventors: Shigeru Mori; Makoto Suwa; Hiroshi Miyamoto; Yoshikazu Morooka; Shigeru Kikuda; Mitsuya Kinoshita, all of Hyogo, Japan

[73] Assignee: Mitsubishi Denki Kabushiki Kaisha, Tokyo, Japan

[21] Appl. No.: 750,040

[22] Filed: Aug. 27, 1991

[30] Foreign Application Priority Data

| Aug. 29, 1990 [JP] | Japan | 2-229086 |
|---|---|---|
| Sep. 29, 1990 [JP] | Japan | 2-261212 |
| Aug. 12, 1991 [JP] | Japan | 3-202006 |

[51] Int. Cl.[6] .................................. G06F 15/20
[52] U.S. Cl. .................................. 371/21.1; 364/579
[58] Field of Search ............. 307/530; 330/257; 364/579, 580; 371/21.1, 25.1

[56] References Cited

U.S. PATENT DOCUMENTS

| Re. 31,056 | 10/1982 | Chau et al. | 371/25.1 X |
|---|---|---|---|
| 4,479,202 | 10/1984 | Uchida | 365/190 |
| 4,713,797 | 12/1987 | Morton et al. | 330/257 X |
| 4,954,992 | 9/1990 | Kumanoya et al. | 365/207 |
| 4,962,482 | 10/1990 | Jinb | 307/530 X |
| 4,984,206 | 1/1991 | Komatsu et al. | 365/208 |
| 5,034,923 | 7/1991 | Kuo et al. | 365/189.01 |
| 5,046,049 | 9/1991 | Choi et al. | 365/201 |
| 5,068,830 | 11/1991 | Plants et al. | 307/530 X |
| 5,200,926 | 4/1993 | Iwashashi et al. | 365/233.5 |
| 5,214,609 | 5/1993 | Kato et al. | 365/230.01 |

FOREIGN PATENT DOCUMENTS

| 0264893A2 | 4/1988 | European Pat. Off. |
| 0410492A2 | 1/1991 | European Pat. Off. |
| 63-9319 | of 0000 | Japan |
| 2222461A | 3/1990 | United Kingdom |
| 2248326A | 4/1992 | United Kingdom |

OTHER PUBLICATIONS

1989 IEEE International Solid–State Circuits Conference, Digest of Technical Papers, Feb. 1989, "FAM 16.4: A 60ns 3.3V 16Mb DRAM", Arimoto et al..

1987 Symposium on VLSI Circuits, Digest of Technical Papers, IEEE Cat. No. 87 TH 0190-9, May 1987, "BIC-MOS Circuit Technology for High Speed DRAMs", Watanabe et al., pp. 79-80.

1990 Symposium on VLSI Circuits, Digest of Technical Papers, IEEE Cat. No. 90 CH 2885-2, Jun. 1990, "A 1.5V Circuit Technology for 64 Mb DRAMs", Nakagome et al. pp. 17-18.

*Primary Examiner*—Edward R. Cosimano
*Attorney, Agent, or Firm*—Lowe, Price, LeBlanc & Becker

[57] ABSTRACT

A semiconductor memory device includes a memory array. The bit line pairs of the odd number order in the memory array belong to a first group, and the bit line pairs of the even number order belong to a second group. A first amplifier is connected to each bit line pair. Corresponding to the first group, write buses read buses and a read/test circuit are provided. Corresponding to the second group, write buses read buses and a read/test circuit are provided. A column decoder selects a plurality of bit line pairs simultaneously at the time of testing. At the time of testing, each of the read/test circuits compares data read out from the plurality of bit line pairs belonging to the corresponding group with a given expected data for providing the comparison result.

19 Claims, 34 Drawing Sheets

FIG. 5

(X ADDRESS)

|  | WL1 | WL2 | WL3 | WL4 | WL5 | |
|---|---|---|---|---|---|---|
| BL1 | H | L | H | L | H | ---------- |
| BL2 | L | H | L | H | L | ---------- |
| BL3 | H | L | H | L | H | ---------- |
| BL4 | L | H | L | H | L | ---------- |
| BL5 | H | L | H | L | H | ---------- |
| BL6 | L | H | L | H | L | ---------- |

(Y ADDRESS)

(COLUMN PREDECODER)

(COLUMN MAIN DECODER)

(ASYMMETRIC TYPE DIFFERENTIAL AMP.)

FIG. 18 A
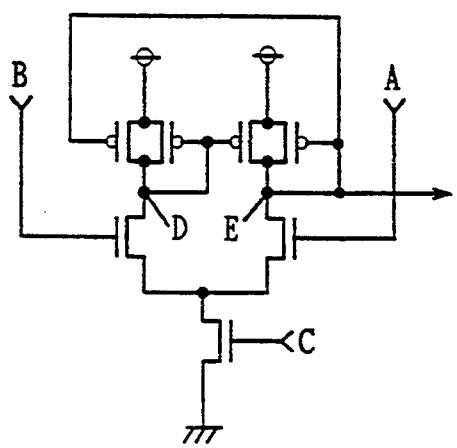
(SYMMETRIC TYPE DIFFERENTIAL AMP.)
FIG. 18 B
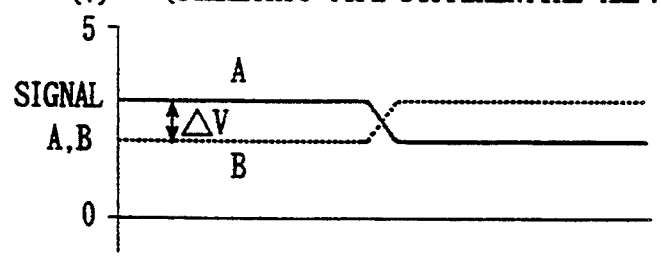
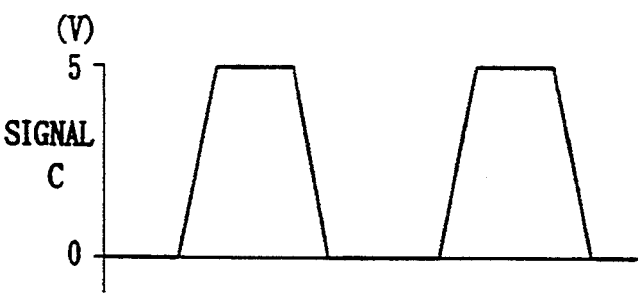
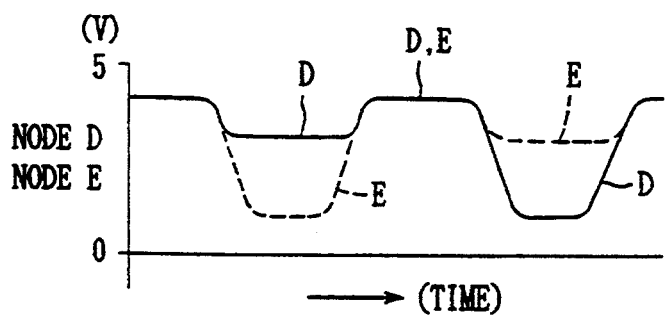

FIG. 19

Y ADDRESS

|   | 1 | 2 | 3 | 4 | 5 | 6 | 7 | 8 | ...... |
|---|---|---|---|---|---|---|---|---|---|
| 1 | H | H | H | H | H | H | H | H | |
| 2 | L | L | L | L | L | L | L | L | |
| 3 | H | H | H | H | H | H | H | H | |
| 4 | L | L | L | L | L | L | L | L | |
| 5 | H | H | H | H | H | H | H | H | |
| 6 | L | L | L | L | L | L | L | L | |
| 7 | H | H | H | H | H | H | H | H | |
| 8 | L | L | L | L | L | L | L | L | |

X ADDRESS (ROW STRIPE)

FIG. 20

Y ADDRESS

|   | 1 | 2 | 3 | 4 | 5 | 6 | 7 | 8 | ...... |
|---|---|---|---|---|---|---|---|---|---|
| 1 | H | L | H | L | H | L | H | L | |
| 2 | L | H | L | H | L | H | L | H | |
| 3 | H | L | H | L | H | L | H | L | |
| 4 | L | H | L | H | L | H | L | H | |
| 5 | H | L | H | L | H | L | H | L | |
| 6 | L | H | L | H | L | H | L | H | |
| 7 | H | L | H | L | H | L | H | L | |
| 8 | L | H | L | H | L | H | L | H | |

X ADDRESS (CHECKER BOARD)

FIG. 21

Y ADDRESS

|   | 1 | 2 | 3 | 4 | 5 | 6 | 7 | 8 | ---- |
|---|---|---|---|---|---|---|---|---|---|
| 1 | H | H | H | H | H | H | H | H | |
| 2 | H | H | H | H | H | H | H | H | |
| 3 | L | L | L | L | L | L | L | L | |
| 4 | L | L | L | L | L | L | L | L | |
| 5 | H | H | H | H | H | H | H | H | |
| 6 | H | H | H | H | H | H | H | H | |
| 7 | L | L | L | L | L | L | L | L | |
| 8 | L | L | L | L | L | L | L | L | |

X ADDRESS (2-ROW STRIPE)

FIG. 22

Y ADDRESS

|   | 1 | 2 | 3 | 4 | 5 | 6 | 7 | 8 | ---- |
|---|---|---|---|---|---|---|---|---|---|
| 1 | H | L | H | L | H | L | H | L | |
| 2 | H | L | H | L | H | L | H | L | |
| 3 | L | H | L | H | L | H | L | H | |
| 4 | L | H | L | H | L | H | L | H | |
| 5 | H | L | H | L | H | L | H | L | |
| 6 | H | L | H | L | H | L | H | L | |
| 7 | L | H | L | H | L | H | L | H | |
| 8 | L | H | L | H | L | H | L | H | |

X ADDRESS (2-COLUMN CHECKER)

FIG. 23

Y ADDRESS

|   | 1 | 2 | 3 | 4 | 5 | 6 | 7 | 8 | ..... |
|---|---|---|---|---|---|---|---|---|---|
| 1 | H | H | L | L | H | H | L | L | |
| 2 | H | H | L | L | H | H | L | L | |
| 3 | L | L | H | H | L | L | H | H | |
| 4 | L | L | H | H | L | L | H | H | |
| 5 | H | H | L | L | H | H | L | L | |
| 6 | H | H | L | L | H | H | L | L | |
| 7 | L | L | H | H | L | L | H | H | |
| 8 | L | L | H | H | L | L | H | H | |

X ADDRESS (DOUBLE CHECKER)

FIG. 24

Y ADDRESS

|   | 1 | 2 | 3 | 4 | 5 | 6 | 7 | 8 | ..... |
|---|---|---|---|---|---|---|---|---|---|
| 1 | H | L | H | L | H | L | H | L | |
| 2 | H | L | H | L | H | L | H | L | |
| 3 | H | L | H | L | H | L | H | L | |
| 4 | H | L | H | L | H | L | H | L | |
| 5 | H | L | H | L | H | L | H | L | |
| 6 | H | L | H | L | H | L | H | L | |
| 7 | H | L | H | L | H | L | H | L | |
| 8 | H | L | H | L | H | L | H | L | |

X ADDRESS (COLUMN STRIPE)

(X ADDRESS)

SEMICONDUCTOR MEMORY DEVICE COMPRISING A TEST CIRCUIT AND A METHOD OF OPERATION THEREOF

CROSS-REFERENCE TO RELATED APPLICATIONS

This application is related to applications Ser. Nos. 400,899, filed Aug. 30, 1989, now U.S. Pat. No. 5,060,230; 506,616, filed Apr. 10, 1990, now U.S. Pat. No. 5,022,007; 750,050, Aug. 27, 1991, commonly assigned with the present invention.

BACKGROUND OF THE INVENTION

1. Field of the Invention

The present invention relates to semiconductor memory devices, and more particularly, to a semiconductor memory device comprising a test circuit, and a method of operation thereof.

2. Description of the Background Art

FIG. 38 is a circuit diagram showing a structure of main components of a conventional dynamic random access memory (referred to as a DRAM hereinafter).

Referring to FIG. 38, a plurality of bit line pairs BL0, $\overline{BL0}$–BL1023, $\overline{BL1023}$ and a plurality of word lines WL0, WL1 are arranged to cross each other, with memory cells MC0, MC1 at the crossing points thereof. Memory cell MC0 comprises a capacitor C0 having a capacitance value of CS, and an N channel MOS transistor Q30. Memory cell MC1 comprises a capacitor C1 and an N channel MOS transistor Q31. Capacitor C0 is connected to a bit line BL0 via transistor Q30, and capacitor C1 is connected to bit line $\overline{BL0}$ via transistor Q31. The gates of transistors Q30 and Q31 are connected to word lines WL0, WL1, respectively.

A sense amplifier circuit SE including N channel MOS transistors Q32 and Q33, and a restore circuit RS including P channel MOS transistors Q35 and Q36 are connected to the bit line pair BL0, $\overline{BL0}$. Sense amplifier circuit SE and restore circuit RS constitute a sense amplifier 50. The common node line CN1 of sense amplifier circuit SE is connected to a ground line that receives ground potential $V_{SS}$ via N channel MOS transistor Q34. The common node line CN2 of restore circuit RS is connected to a voltage line that receives supply voltage $V_{CC}$ via P channel MOS transistor Q37. The gates of transistors Q34 and Q37 are supplied with sense amplifier circuit activation signal $\phi_S$ and restore circuit activation signal $\overline{\phi_S}$.

Bit lines BL0 and $\overline{BL0}$ are connected to an input/output line pair I/O and $\overline{I/O}$ via N channel MOS transistors Q41 and Q42. An N channel MOS transistor Q38 is connected between bit line BL0 and bit line $\overline{BL0}$. Bit lines BL0 and $\overline{BL0}$ are coupled to a precharge potential $V_{BL}$ via N channel MOS transistors Q39 and Q40, respectively. Precharge potential $V_{BL}$ is approximately one half of supply voltage $V_{CC}$. The gates of transistors Q38–Q40 are supplied with bit line equalize signal $\phi_{EQ}$.

Word lines WL0 and WL1 are connected to a row decoder (not shown). The row decoder responds to an external row address signal to select one word line. The selected word line is driven by a word line driving circuit (not shown). The gates of transistors Q41 and Q42 are supplied with a column select signal Y0 by a column decoder (not shown). The column decoder responds to an externally applied column address signal to select one of the plurality of bit line pairs, whereby the corresponding column select signal is activated. As a result, the bit line pair is connected to input/output line pair I/O and $\overline{I/O}$. A write driver 140 is connected to input/output line pair I/O and $\overline{I/O}$, and receives write data WD.

The read out operation of the DRAM of FIG. 38 is explained hereinafter with reference to the waveform chart of FIG. 39.

Prior to the read out starting time of t1, equalize signal $\phi_{EQ}$ is at a H level. This causes bit lines BL0 and $\overline{BL0}$ to be precharged to precharge potential $V_{BL}$. At time t0, equalize signal $\phi_{EQ}$ drops to a L level. This disconnects bit lines BL0 and $\overline{BL0}$ from each other, and bit lines BL0 and $\overline{BL0}$ are disconnected from precharge potential $V_{BL}$.

At time t1, the potential of word line WL0, for example, rises. This causes the charge stored in capacitor C0 of memory cell MC0 to be read out to bit line BL0. Assuming that a L data has been written in capacitor C0, the potential of bit line BL0 becomes lower than the potential ($V_{BL}$) of bit line $\overline{BL0}$.

Then at time t2, activation signal $\phi_S$ rises to a H level to bring sense amplifier circuit SE to an activated state. As a result, the potential difference between bit lines BL0 and $\overline{BL0}$ is amplified to drop the potential of bit line BL0 to ground potential $V_{SS}$.

At time t3 when activation signal $\overline{\phi_S}$ drops to a L level, restore circuit RS is activated. This causes the potential of bit line $\overline{BL0}$ to rise to supply voltage $V_{CC}$.

At time t4, transistors Q41 and Q42 are turned on by the column decoder. This causes data on bit line pair BL0, $\overline{BL0}$ to be read out to input/output line pair I/O, $\overline{I/O}$. At time t5 when activation signal $\phi_S$ drops to a L level, the amplifier circuit SE is inactivated. At time t6 when activation signal $\overline{\phi_S}$ attains a H level, restore circuit RS becomes inactivated. At time t7 when equalize signal $\phi_{EQ}$ attains a H level, bit line pair BL0, $\overline{BL0}$ is again precharged to precharge potential $V_{BL}$.

The writing operation of the DRAM of FIG. 38 will be explained hereinafter with reference to the waveform chart of FIG. 40.

The operation from time t0 to time t3 are similar to the read out operation of the identical time. At time t4, transistors Q41 and Q42 are turned on by the column decoder. During writing operation, write data is applied to input/output line pair I/O, $\overline{I/O}$ by write driving circuit 140. When bit line pair BL0, $\overline{BL0}$ is connected to input/output line pair I/O, $\overline{I/O}$, the data on bit line pair BL0, $\overline{BL0}$ are overwritten by the data on input/output line pair I/O, $\overline{I/O}$. The overwritten data is written into the memory cell. The operation from time t5 to time t7 are similar to the read out operation of the identical time.

In recent years, increase in testing time has become significant as the size of semiconductor devices has increased. As a technique to reduce testing time drastically, a line mode test is proposed in 1989 IEEE International Solid-State Circuits Conference Digest of Technical Papers, pp. 244–245. According to this line mode test, all the memory cells connected to one word line are tested simultaneously to allow testing of a number of bits at one time. This is expected to reduce testing time significantly.

FIG. 41 shows the structure of main components of a conventional dynamic type semiconductor memory device having a line mode test function.

Referring to FIG. 41, a plurality of bit line pairs BL, $\overline{BL}$ and a plurality of word lines WL are arranged perpendicular to each other, with a memory cell MC at each crossing point. The plurality of word lines WL are connected to a row decoder 3 comprising a decoder 31 and a word driver 32. A sense amplifier 50 is connected to each bit line pair BL, $\overline{BL}$. Each bit line pair BL, $\overline{BL}$ is connected to input/output line pair I/O, $\overline{I/O}$ via N channel MOS transistors 121, 122 and N channel MOS transistors 125, 126. Transistors 121, 122, 125 and 126 implement a transfer gate. The gates of transistors 125 and 126 are supplied with a column selecting signal Yi (i=1, 2, ...) from a column decoder 4. A comparison circuit 100 and a latch circuit 110 are provided corresponding to each bit line pair BL, $\overline{BL}$.

Row decoder 3 is responsive to an externally applied row address signal RA to select one of the plurality of word lines WL, to raise the potential thereof to a H level. A column decoder 4 is responsive to an externally applied column address signal CA to select one of the plurality of bit line pairs BL, $\overline{BL}$ to provide column selecting signal Yi of a H level to the gates of the corresponding transistors 125 and 126. Thus, one memory cell MC is selected, whereby data is written into the selected memory cell MC via input/output line pair I/O, $\overline{I/O}$, or data stored in the selected memory cell MC is read out to an external source via input/output line pair I/O, $\overline{I/O}$.

The line mode test will be explained hereinafter. In line mode test, an externally applied expected data is first stored in a latch circuit 110. Data read out from the memory cell MC connected to the selected word line WL and the expected data stored in latch circuit 110 are compared by a comparison circuit 100. Hence, the testing of a plurality of memory cells MC connected to one word line WL is performed at one time.

First, writing test data into memory cell MC will be explained.

Transistors 125 and 126 selected by column decoder 4 are turned on. This causes external test data applied through input/output line pair I/O, $\overline{I/O}$ to be transmitted to nodes NA and NB. This test data is stored in latch circuit 110. The test data stored in latch circuit 110 is the expected data at the time of testing. Signal TR is at a L level at this time. Transistors 121 and 122 are off and test data in nodes NA and NB are not transmitted to bit line pair BL, $\overline{BL}$. By sequentially selecting a plurality of pairs of transistors 125 and 126 by column decoder 4, test data is sequentially stored in a plurality of latch circuits 110.

Signal TR then rises to a H level. This turns transistors 121 and 122 on. One of the plurality of word lines WL is selected by row decoder 3. This causes the test data stored in latch circuit 110 to be written into each memory cell MC connected to the selected word line WL. By sequentially selecting a plurality of word lines WL by row decoder 3, test data is written into all the memory cells MC.

The read out of the test data stored in memory cell MC, and the comparison of the read out test data with the expected data will be explained hereinafter.

One of the plurality of word lines WL is selected by the row decoder 3. This causes test data to be read out from the memory cell MC connected to the selected word line WL into the corresponding bit line pair BL, $\overline{BL}$. The read out test data is amplified by the corresponding sense amplifier 50.

Signal LTE rises to a H level, while signal TR is still at the L level. This turns on N channel MOS transistors 123 and 124. As a result, the test data read out from each memory cell are transmitted to the corresponding comparison circuits 100. Each comparison circuit 100 is supplied with the expected data stored in latch circuit 110 via nodes NA, NB and NV, NW. Each comparison circuit 100 compares the test data read out from memory cell MC with the expected data stored in latch circuit 110 to provide the comparison result to detection line LTS.

When the test data read out from memory cell MC matches the expected data stored in latch circuit 110 in all comparison circuits 100, the potential of detection line LTS is maintained at a H level. If the test data read out from memory cell MC does not match the expected data stored in latch circuit 110 in at least one comparison circuit 110, the potential of detection line LTS is discharged to a L level.

FIG. 42 shows in detail the structure of comparison circuit 100 and latch circuit 110 of FIG. 41.

Comparison circuit 100 comprises N channel MOS transistors 101-104. Latch circuit 110 comprises N channel MOS transistors 111, 112 and P channel MOS transistors 113, 114.

When column selecting signal Yi attains a H level by column decoder 4 (FIG. 41), transistors 125 and 126 are turned on. This causes externally applied test data to be transmitted to nodes NA and NB via input/output line pair I/O, $\overline{I/O}$ and to be stored in latch circuit 110. When signal CRE attains a H level and signal $\overline{CRE}$ attains a L level, N channel MOS transistor 127 and P channel MOS transistor 128 are each turned on. This causes the potential of H level of either nodes NA or NB to be set to the supply level, and the potential of the L level set to the ground level.

At the time of testing, the potential of node NC is in advance set to a L level, by turning on N channel MOS transistor 103 with signal LTR. The potential of detection line LTS is set to a H level in advance.

When signal LTE rises to a H level while signal TR remains at a L level, transistors 123 and 124 are turned on. This causes nodes NE and NF of bit line pair BL, $\overline{BL}$ to be connected to comparison circuit 100. For example, if the potential of node NA is at a H level, and the potential of node NB is at a L level, transistor 102 is on and transistor 101 is off.

If correct test data is read out from memory cell MC, the potential of node NE is at a H level, and the potential of node NF is at a L level. The potential of node NC remains at a L level. Therefore, N channel MOS transistor 104 is off, and the potential of node ND of detection line LTS remains at a H level.

If erroneous test data is read out from memory cell MC, the potential of node NE is at a L level, and the potential of node NF is at the H level. The potential of node NC therefore attains a H level to turn on transistor 104. This causes the potential of node ND of detection line LTS to drop to L. Hence, error is detected.

Although test operation regarding one pair of bit lines BL and $\overline{BL}$ is described in FIG. 42, the above-mentioned operation is carried out for all bit line pairs BL, $\overline{BL}$ at one time. Even if only one erroneous test data is read out from one memory cell MC, node ND of detection line LTS drops to a L level.

The line mode test of a conventional dynamic type semiconductor memory device can be summarized as follows.

First, an external applied test data is stored in a plurality of latch circuits 110. Then, test data from a plurality of latch circuits 110 are written into a plurality of memory cells connected to a selected word line WL at one time. This writing operation is repeated for each word line.

Then, test data are read out from a plurality of memory cells MC connected to the selected word line WL simultaneously. The read out test data are compared with the data stored in latch circuits 110. This read out operation and comparison operation are also carried out for each word line.

Line mode test is completed when the test data read out from memory cell MC matches the expected data stored in latch circuit 110 in each comparison operation. If the test data read out from memory cell MC does not match the expected data stored in latch circuit 110 even in one comparison operation, an error flag of a L level is provided from detection line LTS.

It is necessary to provide a plurality of latch circuits and a plurality of comparison circuits corresponding to the number of plurality of bit line pairs for carrying out the line mode test in the above conventional semiconductor memory device. This arrangement disadvantageously consumes the layout area.

It was necessary to carry out one writing operation, for each bit line pair in writing the test data to the plurality of latch circuits and bit line pairs. Therefore, reduction in testing time could not be expected.

It was also necessary to simultaneously overwrite the data of a great number of memory cells in the writing operation of the line mode test. For example, it was necessary to overwrite simultaneously data of memory cells of 1024 bits in the DRAM of FIG. 38. This requires a write driver having a current handling capability approximately 1024 times of that of a normal writing operation.

A large write driver was necessary for carrying out writing operation of the line mode test in a conventional semiconductor memory device having line mode test feature. This is responsible for the increase in chip area.

SUMMARY OF THE INVENTION

An object of the present invention is to reduce testing time of a semiconductor memory device without increasing layout area.

Another object of the present invention is to provide a semiconductor memory device capable of high speed operation without a large increase in layout area, and with a large reduction in testing time.

A further object of the present invention is to allow testing of various test patterns at high speed without increasing layout area.

A still further object of the present invention is to provide an operation method of allowing reduction in testing time and capable of reading out data at high speed in a semiconductor memory device comprising a test circuit without increasing layout area.

A semiconductor memory device according to the present invention includes a memory array having a plurality of memory cells arranged in a plurality of rows and columns. The plurality of columns of the memory array is divided into a plurality of groups in an interleaved manner. The semiconductor memory device further includes la selecting circuit, a reading circuit, a plurality of test circuits corresponding respectively to the plurality of groups, and an indicating circuit. The selecting circuit simultaneously selects all columns in each group in a selected row during testing operation. The reading circuit reads data stored in the memory cells of the selected rows and columns. Each of the plurality of test circuits simultaneously compares data read out from the selected columns belonging to the corresponding group with a predetermined expected data. The indicating circuit provides a result of the plurality of test circuits.

According to the semiconductor memory device, in each group, data read out from each of the plurality of columns and an expected data are compared by each test circuit to provide the comparison result during testing operation.

The testing time is reduced because each test circuit carries out testing of a plurality of columns simultaneously. Because each test circuit is provided common to the plurality of columns, increase in layout area by the test circuit is minimized. Memory cell testing of a plurality of test patterns can be carried out by setting a different expected data for each test circuit.

A semiconductor memory device according to another aspect of the present invention includes a memory array provided with a plurality of word lines, a plurality of bit line pairs crossing the plurality of word lines, and a plurality of memory cells at the crossings of the word lines and the bit line pairs. The plurality of bit line pairs are divided into a plurality of groups in an interleaved manner.

The semiconductor memory device further includes a plurality of write buses corresponding respectively to the plurality of groups, a plurality of read buses corresponding respectively to the plurality of groups, a plurality of first amplifiers each provided between each of the plurality of bit line pairs and a corresponding read bus, and a plurality of second amplifiers corresponding respectively to the plurality of groups.

The semiconductor memory device further includes a plurality of expected data input circuits, a selecting circuit, a connecting circuit, and an activation circuit. The plurality of expected data input circuits are provided corresponding respectively to the plurality of groups to store an expected data. The selecting circuit selects a single one of the plurality of bit line pairs for reading and writing during normal operation, and simultaneously selects all of bit line pairs in each group during testing operation. The connecting circuit connects a bit line pair selected by the selecting circuit to a corresponding write bus during normal operation. The activation circuit activates a first amplifiers corresponding to a selected bit line pair.

During normal reading operation, the activated first amplifier and the corresponding second amplifier form a current mirror type amplifier. During testing operation, each activated first amplifier compares the data of the corresponding bit line pair with a corresponding expected data to provide the comparison result to the corresponding read bus.

In accordance with the semiconductor memory device, a plurality of bit line pairs are selected simultaneously, and the first amplifiers corresponding to the selected bit line pairs are activated during testing operation. By each activated first amplifier, data of the corresponding bit line pair is compared with the data applied from the corresponding expected data input circuit to provide the comparison result to the corresponding read bus. Each first amplifier acts as a comparison means in this case.

Testing time is reduced due to the first amplifiers carrying out testing simultaneously for a plurality of bit line pairs. By providing different expected data with each expected data input circuit, testing of memory cells by various test patterns can be carried out.

During normal reading operation, any of the plurality of bit line pairs is selected, and the first amplifier corresponding to the selected bit line is activated. The activated first amplifier constitutes a current mirror type amplifier with the corresponding second amplifier.

This causes data of the selected bit line pair to be amplified to be read out at high speed to the corresponding read bus. The first amplifier acts as amplifying means in this case.

Particularly, data can be read out at high speed because the write buses are not connected to the bit line pairs during normal reading operation.

During normal writing operation, one of the plurality of bit line pairs is selected, whereby the selected bit line pair is connected to the corresponding write bus.

This allows data to be written into the memory cell connected to the selected bit line pair via the write bus.

In accordance with the semiconductor memory device, each first amplifier acts as comparison means during testing operation, and acts as amplifying means during normal reading operation. Each second amplifier is connected in common to the plurality of bit line pairs in each group. Thus, increase in layout area by the circuit is minimized.

According to a further aspect of the present invention, the semiconductor memory device is capable of normal operation, and also test operation for testing a plurality of memory cells simultaneously. The semiconductor memory device includes a plurality of word lines, a plurality of bit lines provided to cross the plurality of word lines, a plurality of memory cells provided at the crossings of the word lines and the bit lines, and an amplifier for amplifying data applied to the plurality of bit lines. The semiconductor memory device further includes a control circuit which activates the amplifier at normal reading/writing operation, and which temporarily inactivates the amplifier, and then reactivates the amplifier at the writing of test operation. The semiconductor memory device may further include an equalize circuit that equalizes the potential of each of the plurality of bit lines when the amplifier is inactivated by the control circuit at the time of writing of test operation.

In accordance with the semiconductor memory device at the time of writing of test operation, the amplifier is temporarily inactivated, and then the potentials of the bit lines are equalized, with the amplifier activated again. Thus, writing in test operation can be carried out easily.

This will reduce the load of the write driver to eliminate the need of a write driver having a large current-handling capability. As a result, a semiconductor memory device having a small chip area can be provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram for explaining an example of a line mode test according to the semiconductor memory device of FIG. 1.

FIG. 18A shows a structure of a symmetric type differential amplifier.

FIG. 18B is a waveform chart for explaining the characteristic of the symmetric type differential amplifier.

FIGS. 19, 20, 21, 22, 23 and 24 show examples of field patterns.

DESCRIPTION OF THE PREFERRED EMBODIMENTS

Figure 1:
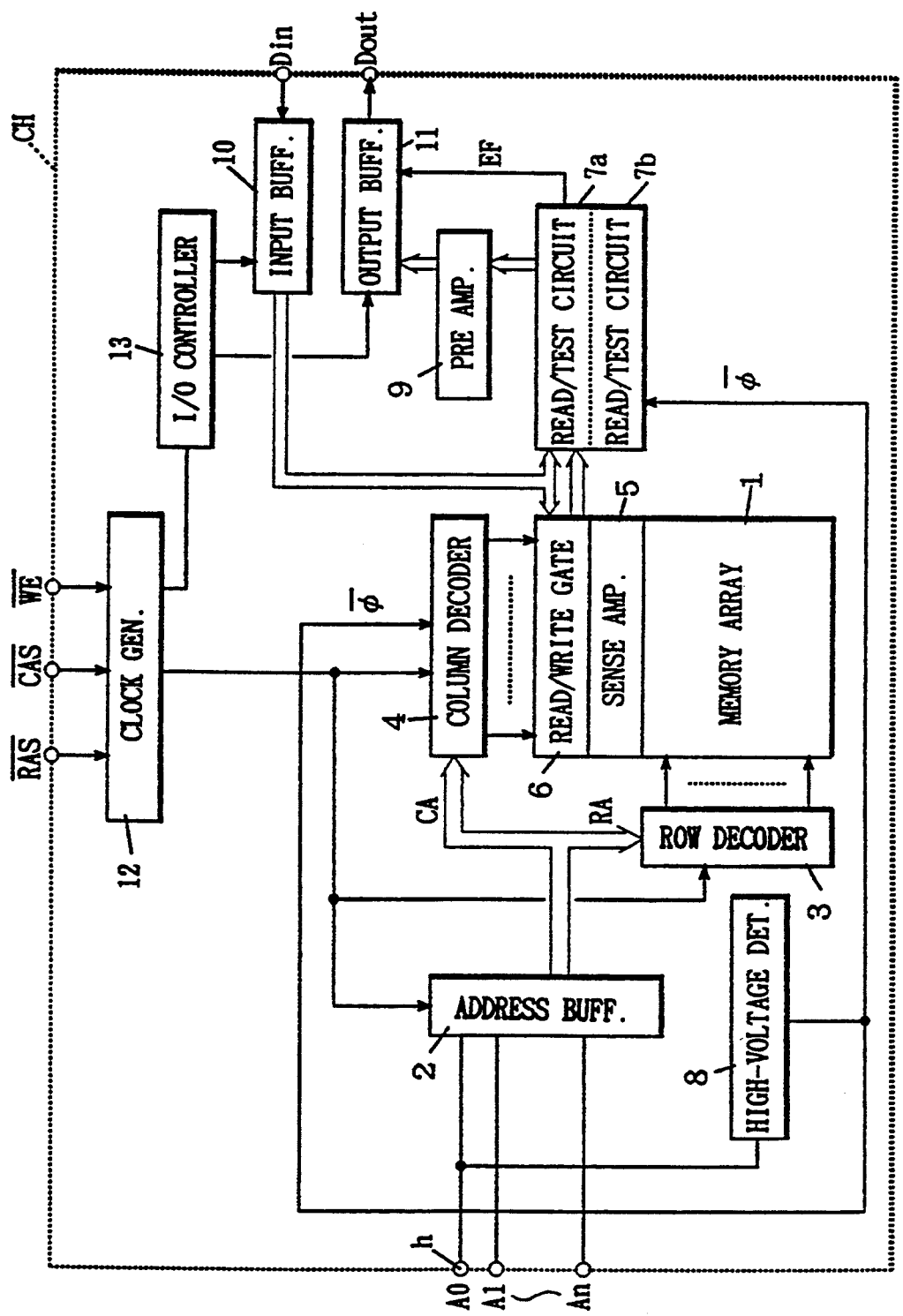
FIG. 1 is a block diagram showing the entire chip structure of a semiconductor memory device according to an embodiment of the present invention.

FIG. 1 is a block diagram showing a chip structure of a dynamic type semiconductor memory device according to an embodiment of the present invention.

A memory array 1 comprises a plurality of memory cells having a plurality of rows and columns arranged in a matrix manner. An address buffer 2 receives external address signals A0–An to provide a row address signal RA and a column address signal CA to a row decoder 3 and a column decoder 4, respectively, at a predetermined timing. A read/write gate 6 is connected to memory array 1 via a sense amplifier group 5. Two read/test circuits 7a and 7b are connected to read/write gate 6.

A high-voltage detector 8 is responsive to the potential of input terminal h which receives an address signal A0 to generate a test enable signal $\overline{U}$. This test enable signal $\overline{\phi}$ is applied to column decoder 4 and read/test circuits 7a and 7b. The output of read/test circuits 7a and 7b is provided to an external source as output data Dout via a preamplifier 9 and an output buffer 11. An external input data Din is applied to read/write gate 6 via an input buffer 10.

A clock generator 12 is responsive to externally applied row address strobe signal $\overline{RAS}$, column address strobe signal $\overline{CAS}$, and write enable signal $\overline{WE}$ to control the timing of each component. An I/O controller 13 activates input buffer 10 at the time of data writing, and activates output buffer 11 at the time of data read out. At line mode testing, in response to an error detection, output buffer 11 provides an error flag EF from read/test circuits 7a and 7b to an external source. Each component shown in FIG. 1 is formed on chip CH.

Figure 2:
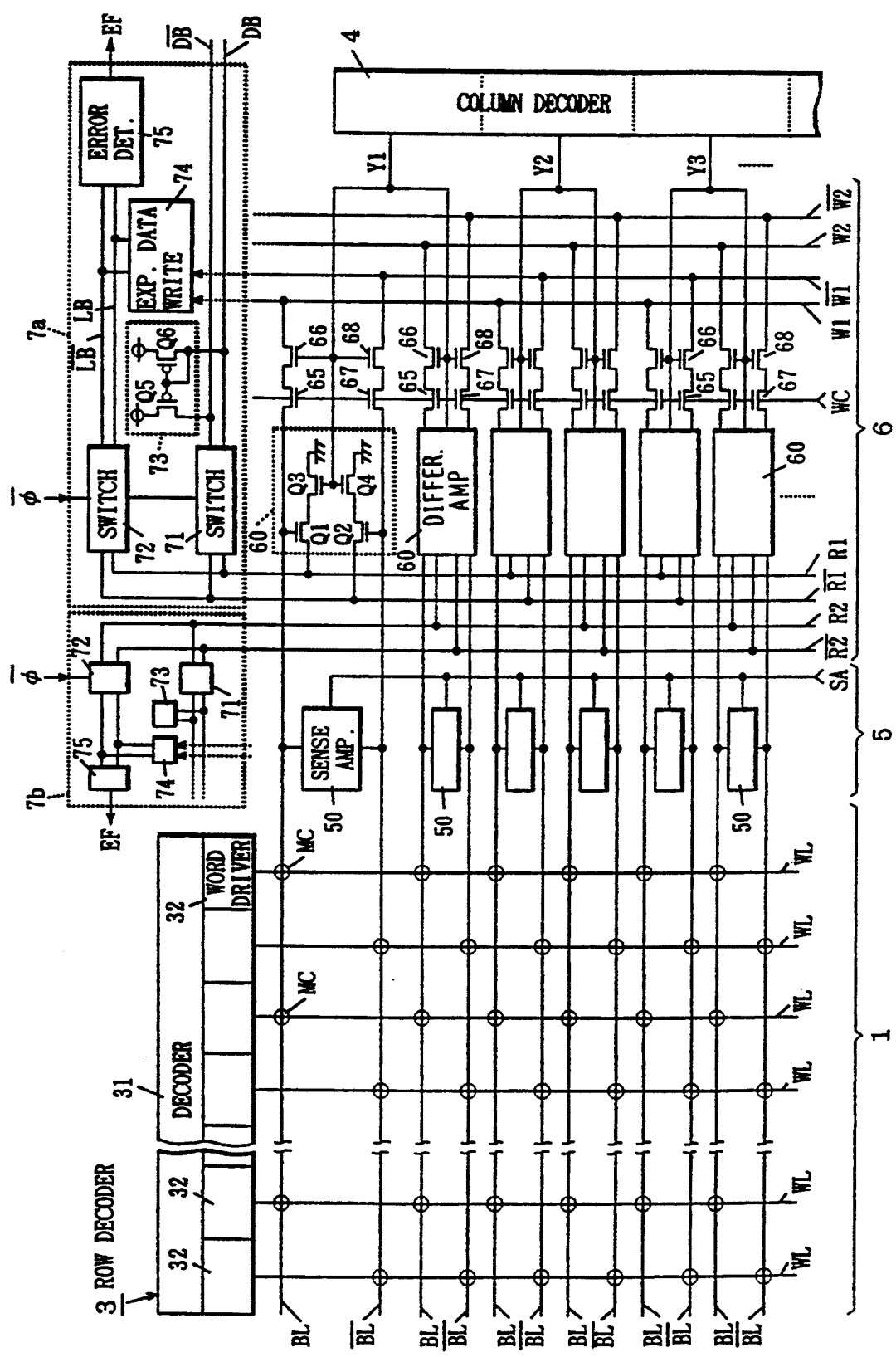
FIG. 2 is a circuit diagram showing a structure of the main components of the semiconductor memory device of FIG. 1.

FIG. 2 is a circuit diagram showing in detail a structure of the main components of the semiconductor memory device of FIG. 1.

Similar to a conventional semiconductor memory device, memory array 1 comprises a plurality of bit line pairs BL, $\overline{BL}$, a plurality of word lines WL arranged to cross bit line pairs BL, $\overline{BL}$, and a plurality of memory cells MC provided at the crossing points thereof. The plurality of word lines WL are connected to row decoder 3. Row decoder 3 comprises a decoder 31 selecting one of the plurality of word lines WL in response to row address signal RA, and a word driver 32 for driving the potential of the selected word line WL to a H level. A sense amplifier 50 is connected between each bit line pair BL and $\overline{BL}$.

The plurality of bit line pairs BL, $\overline{BL}$ are divided into first and second groups. The bit line pair BL, $\overline{BL}$ of an odd number order belongs to the first group, and the bit line pair BL, $\overline{BL}$ of an even number order belongs to the second group. A first differential amplifier 60 is connected to each bit line pair BL, $\overline{BL}$. Write buses W1, $\overline{W1}$, read buses R1, $\overline{R1}$, and read/test circuit 7a are provided corresponding to the first group. Write buses W2, $\overline{W2}$, read buses R2, $\overline{R2}$ and read/test circuit 7b are provided corresponding to the second group.

The bit line pair B1, $\overline{BL}$ of the odd number order belonging to the first group is connected to write buses W1, $\overline{W1}$ via N channel MOS transistors 65, 67, and 66, 68. The bit line pair BL, $\overline{BL}$ of the even number order belonging to the second group is connected to write buses W2, $\overline{W2}$ via N channel MOS transistors 65, 67 and 66, 68. The gates of transistors 65, 67 are supplied with a writing control signal WC from a clock generator 12 (FIG. 1).

The first differential amplifier 60 belonging to the first group is connected to read buses R1, $\overline{R1}$, whereas the first differential amplifier 60 belonging to the second group is connected to read buses R2, $\overline{R2}$.

The gates of transistors 66, 68 and transistors Q3, Q4 are supplied with a column selecting signal Yi (i=1,2, ...) from column decoder 4. With one column selecting signal Yi, one bit line pair BL, $\overline{BL}$ belonging to the first group and one bit line pair BL, $\overline{BL}$ belonging to the second group are selected simultaneously.

In the present embodiment, column decoder 4 is implemented as a two-way decoder to allow improvement in the decoder pitch.

In the first differential amplifier 60 belonging to the first group, transistors Q1 and Q3 are connected in series between read bus R1 and the ground line, whereas transistors Q2 and Q4 are connected in series between read bus $\overline{R1}$ and the ground line. The gate of transistor Q1 is connected to bit line $\overline{BL}$, whereas the gate of transistor Q2 is connected to bit line BL. In the first differential amplifier 60 belonging to the second group, transistors Q1 and Q2 are connected to read buses R2 and $\overline{R2}$, respectively.

In read/test circuit 7a, a switch 71 is connected between read buses R1, $\overline{R1}$ and data buses DB, $\overline{DB}$, and a switch 72 is connected between read buses R1, $\overline{R1}$ and line test buses LB, $\overline{LB}$. A second differential amplifier 73 is connected to data buses DB, $\overline{DB}$. Second differential amplifier 73 comprises a P channel MOS transistor Q5 connected between the supply terminal and data bus $\overline{DB}$, and a P channel MOS transistor Q6 connected between the supply terminal and data bus DB. The gates of transistors Q5 and Q6 are connected to data bus DB.

An expected data writing circuit 74 is connected to line test buses LB, $\overline{LB}$. Expected data writing circuit 74 is used to write an expected data into line test buses LB and $\overline{LB}$ at the time of line mode testing. An error detection circuit 75 is connected to line test buses LB and $\overline{LB}$. Error detection circuit 75 provides an error flag EF when an error is detected at the time of line mode testing.

Data buses DB, $\overline{DB}$ are connected to output buffer 11 via preamplifier 9 shown in FIG. 1. Error flag EF is supplied to output buffer 11.

Switch 71 becomes conductive by test enable signal $\overline{\phi}$ at the time of normal operation, and switching 72 becomes conductive by test enable signal $\bar{\phi}$ at the time of line mode testing.

The structure of read/test circuit 7b is similar to that of read/test circuit 7a.

In the present semiconductor memory device, a plurality of write buses W1, $\overline{W1}$ and W2, $\overline{W2}$ and a plurality of read buses R1, $\overline{R1}$ and R2, $\overline{R2}$ are separated. This allows high speed access at the time of normal operation. Such a structure is similar to that where the structure disclosed in 1987 VLSI Circuit Symposium pp. 79–80, for example, is applied to the circuit of a MOS transistor.

The operation of the semiconductor memory device of FIGS. 1 and 2 is explained hereinafter.

.Normal Operation

At the time of data writing, one of the plurality of word lines WL is selected by row decoder 3. The potential of the selected word line WL attains a H level. This causes data of H or L to be read out from the memory cell MC connected to the selected word line WL into the corresponding bit line pair BL, $\overline{BL}$. Sense amplifier 50 is then activated by sense amplifier activation signal SA. This results in data of each bit line pair BL, $\overline{BL}$ to be amplified.

Writing control signal WC then attains a H level to turn on transistors 65 and 67. One column selecting signal Yi is selected by column decoder 4, whereby the selected column selecting signal Yi attains a H level. This turns on two pairs of transistors 66 and 68 supplied with the selected column selecting signal Yi. This causes data applied to writing buses W1, $\overline{W1}$ and W2, $\overline{W2}$ to be transferred to two pairs of bit line pairs BL, $\overline{BL}$ corresponding to the selected column selecting signal Yi, whereby the data is written into the selected memory cell MC.

The potential of word line WL then attains a L level. Refresh is carried out in memory cells not selected by column decoder 4 out of all the memory cells connected to the selected word line WL.

At the time of data read out, writing control signal WC is at a L level, whereby write buses W1, $\overline{W1}$ and W2, $\overline{W2}$ are disconnected from bit line pair BL, $\overline{BL}$. Therefore, the signals and load of write buses W1, $\overline{W1}$ and W2, $\overline{W2}$ do not affect bit line pair BL, $\overline{BL}$.

Figure 3:
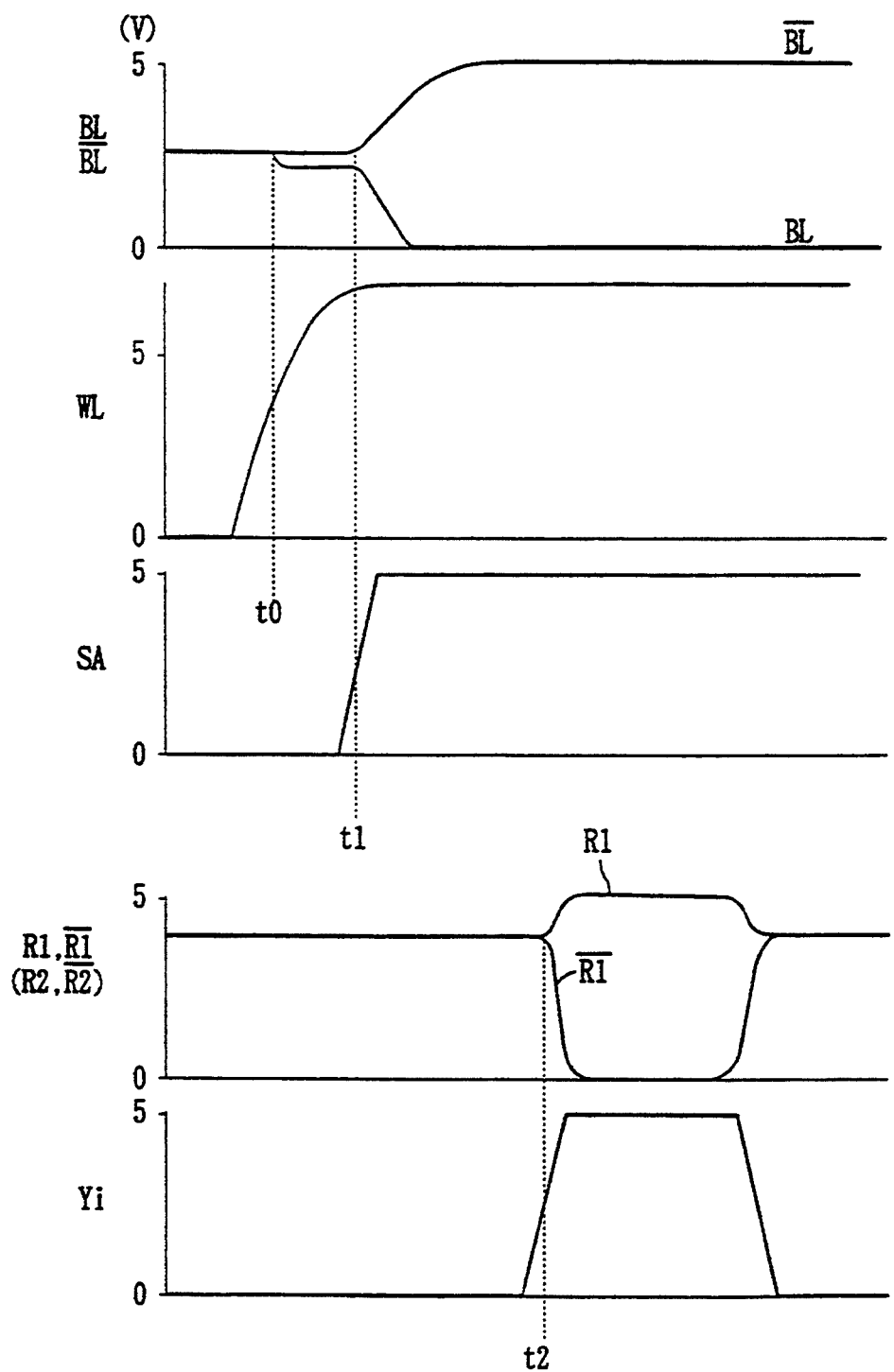
FIG. 3 is a waveform chart for explaining the normal operation of the semiconductor memory device of FIG. 1.

Referring to FIG. 3, the potential of the word line WL selected by row decoder 3 at time t0 rises to a H level. The potential of word line WL rises to a level above supply voltage $V_{CC}$ (5V). This causes data to be read out from the memory cells MC connected to the selected word line WL into the corresponding bit line pair BL, $\overline{BL}$. This results in a small potential difference between bit line pair BL and $\overline{BL}$. Sense amplifier activation signal SA attains a H level at time t1 to amplify the small potential difference between bit line pair BL and $\overline{BL}$. This causes the potential of one of bit lines BL or $\overline{BL}$ to attain a H level, and the potential of the other bit line to a L level.

At time t2, column selecting signal Yi selected by column decoder 4 attains a H level. This causes the two first differential amplifiers 60 corresponding to the selected column selecting signal Yi to operate. The selected first differential amplifier 60 belonging to the first group and the second differential amplifier 73 within read/test circuit 7a constitute a current mirror type differential amplifier. Similarly, the selected first differential amplifier 60 belonging to the second group and the second differential amplifier 73 within read/test circuit 7b constitute a current mirror type differential amplifier.

Each of these current mirror type differential amplifiers rapidly amplifies the small potential difference between the selected bit line pair BL and $\overline{BL}$ to provide the amplified data to the corresponding data buses DB, $\overline{DB}$ via read buses R1, $\overline{R1}$ and R2, $\overline{R2}$. This allows access at high speed.

.Line Mode Test

At the time of writing test data, one of the plurality of word lines WL is selected by row decoder 3, whereby the potential thereof attains a H level. Writing control signal WC attains a H level. At the time of line mode testing, all column selecting signals Yi are selected simultaneously by column decoder 4. i represents 1, 2, ...

As a result, test data applied to write buses W1, $\overline{W1}$ are transmitted to bit line pair BL, $\overline{BL}$ belonging to the first group, and test data applied to write buses W2, $\overline{W2}$ are transmitted to bit line pair B1, $\overline{BL}$ belonging to the second group. Hence, test data is written into the memory cells MC connected to the selected word line WL simultaneously.

Sense amplifier 50 is at an inactivate state due to the following reasons. When memory array 1 comprises 1024 word lines WL and 1024 bit line pairs BL, $\overline{BL}$, for example, test data is written into 512 bit line pairs BL, $\overline{BL}$ by one pair of writing buses. This increases the time required for writing. At the time of writing test data in the line mode test, sense amplifier 50 is made inactive by sense amplifier activation signal SA to increase the speed of writing.

When the same test data are applied to both write buses W1, $\overline{W1}$ and W2, $\overline{W2}$, the same test data is written into all memory cells MC connected to the one selected word line WL.

When a test data of H (potential of W1 is H level; potential of $\overline{W1}$ is L level) is applied to write buses W1, $\overline{W1}$, and a test data of L (potential of W2 is L level; potential $\overline{W2}$ is H level) to write buses W2, $\overline{W2}$, a different test data for every 1 bit is written (H, L, H, L, ...).

When writing of test data of one word line WL is completed, the potential of that word line WL drops to a L level. Then, the potentials of all column selecting signals Yi attain the L level.

Thus, test data is written into the memory cells MC connected to the selected one word line WL. Then, the next word line WL is selected to repeat the above described operation.

Writing to one row of memory cells MC connected to one word line WL is carried out in one cycle. This means that the writing time is reduced to approximately 1/1000 of that of a conventional semiconductor memory device in the case of 1M bit memory array.

The operation of writing a field pattern of a checker board of FIG. 5 into memory array 1 will be explained hereinafter.

Referring to FIG. 5, it is assumed that X addresses WL1, WL2, ... correspond to word line WL, and Y addresses BL1, BL2, ... correspond to bit line pair BL, $\overline{BL}$.

After the selection of the first word line WL, a test data of H is applied to write buses W1, $\overline{W1}$, and a test data of L is applied to writing buses WL2, $\overline{WL2}$. All the column selecting signals Yi rise to a H level, whereby test data is written into the memory cells MC connected to the selected word line WL. Then, the potential of the first word line WL falls to a L level. This causes test data of H, L, H, L, . . . to be written into X address WL1.

Next, the second word line WL is selected. A test data of L is applied to write buses W1, $\overline{W1}$, and a test data of H is applied to write buses W2, $\overline{W2}$. The potentials of all column selecting signals Y1 attain a H level, whereby the test data is written into the memory cells MC connected to the selected word line WL. The potential of the selected word line WL then drops to a L level, whereby test data of L, H, L, H . . . is written into X address WL2. By repeating the above operation, a field pattern of the checker board of FIG. 5 is written.

At the time of reading out test data, writing control signal WC is at a L level. Therefore, bit line pair BL, $\overline{BL}$ is not affected by the signals and load of writing buses W1, $\overline{W1}$ and W2, $\overline{W2}$. Read buses R1, $\overline{R1}$ is connected to line test buses LB, $\overline{LB}$ via switch 72 of read/test circuit 7a. Similarly, read buses R2, $\overline{R2}$ is connected to line test buses LB, $\overline{LB}$ in read/test circuit 7b.

Figure 4:
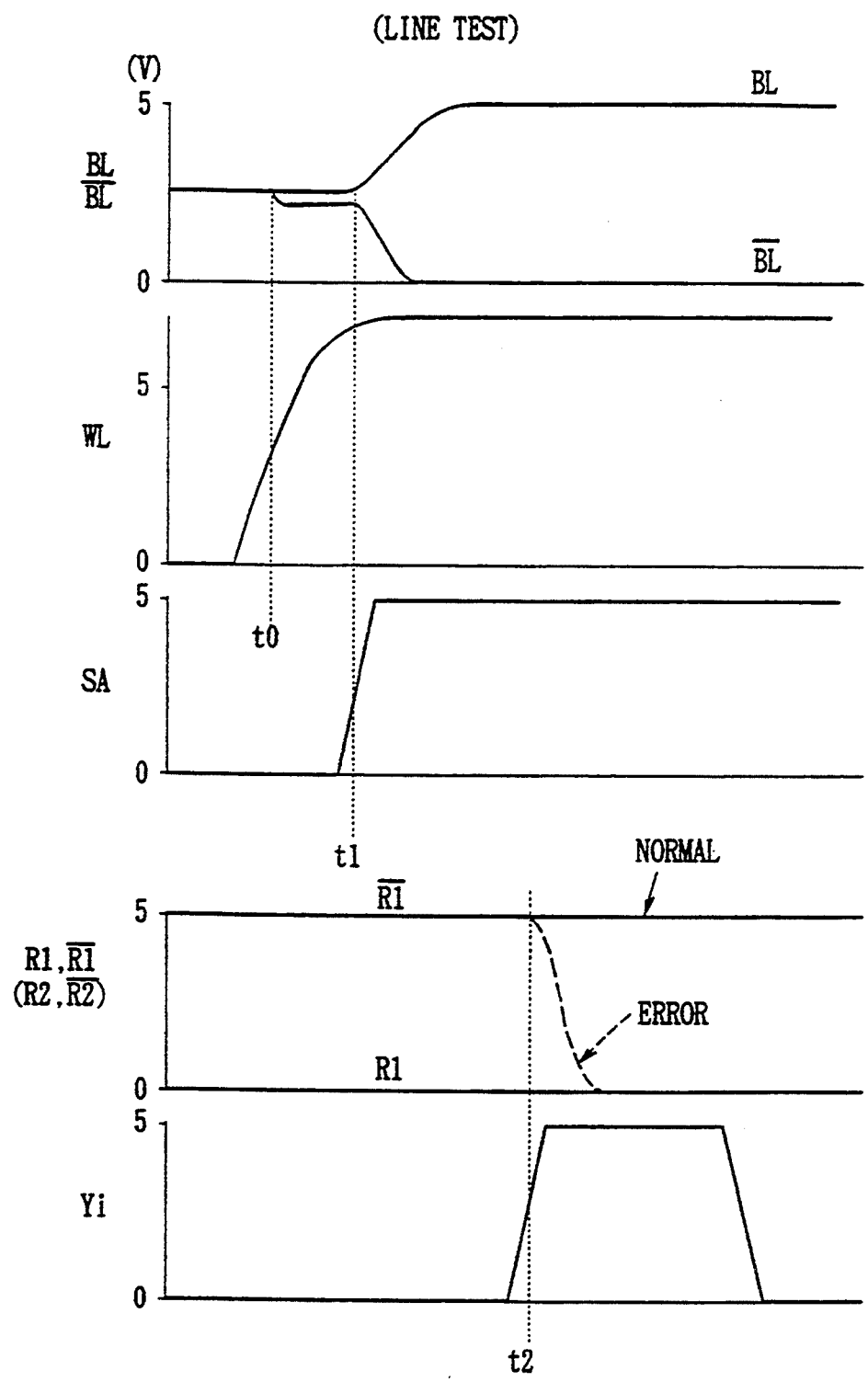
FIG. 4 is a waveform chart for explaining a line mode test of the semiconductor memory device of FIG. 1.

The read out operation where the field pattern of FIG. 5 is written will be explained hereinafter. Referring to FIG. 4, the potential of the selected word line WL rises to a H level at time t0. As a result, test data is read out from the memory cells MC connected to that word line WL into the corresponding bit line pair BL, $\overline{BL}$. Then at time t1, sense amplifier activation signal SA rises to a H level to activate sense amplifier 50. This causes the small potential difference between each bit line pair BL and $\overline{BL}$ to be amplified.

Before column selecting signal Yi rises to a H level, an expected data of L is applied to read buses R1, $\overline{R1}$ by expected data writing circuit 74 in read/test circuit 7a, whereas an expected data of H is applied to read buses R2, $\overline{R2}$ by expected data writing circuit 74 in read/test circuit 7b.

Because a test data of H is read out into the bit line pair BL, $\overline{BL}$ of the odd number order belonging to the first group, the potential of bit line BL attains a H level, and the potential of bit line $\overline{BL}$ attains a L level. Therefore, the first differential amplifier 60 connected to read buses R1, $\overline{R1}$ has transistor Q1 turned on and transistor Q2 turned off. Because a test data of L is read out into the bit line pair BL, $\overline{BL}$ of the even number order belonging to the second group, the potential of bit line BL is at a L level, and the potential of bit line $\overline{BL}$ is at a H level. Therefore, the first differential amplifier 60 connected to read buses R2, $\overline{R2}$ has transistor Q1 turned off and transistor Q2 turned on.

In this state, all column selecting signals Yi rise to a H level at time t2. This turns on transistors Q3 and Q4 in the first differential amplifier 60 connected to read buses R1, $\overline{R1}$, whereby read bus R1 is connected to the ground line via transistors Q1 and Q3. Because the potential of read bus $\overline{R1}$ is precharged to a L level, there is no change in potential. Also, because transistor Q2 is turned off, read bus R1 precharged to a H level in advance is not discharged and the potential thereof is maintained at a H level (refer to FIG. 4).

Similarly, transistors Q3 and Q4 in the first differential amplifier 60 connected to read buses R2, $\overline{R2}$ are turned on. Therefore, read bus $\overline{R2}$ is connected to the ground line via transistors Q2 and Q4. Because read bus $\overline{R2}$ is precharged to a L level in advance, there is no particular change in potential. Also, because transistor Q1 is turned off, read bus R2 precharged to a H level is not discharged and the potential thereof is held at a H level. The foregoing describes the case where all test data are read out correctly.

Let us assume a case where there is one error in the bit line pair $\overline{BL}$ of the odd number order belonging to the first group, for example. The potential of bit line $\overline{BL}$ which should be at the L level is at a H level or an intermediate level. This means that transistor Q2 that should be off is on. As a result, read bus $\overline{R1}$ that is maintained at the H level at the time of normal operation is discharged to a L level via transistors Q2 and Q4, as shown with the broken line of FIG. 4.

If there is at least one erroneous data in the test data read out to the bit line pair BL, $\overline{BL}$ of the odd number order, both the potentials of read buses R1 and $\overline{R1}$ attain a L level, and both the potentials of line test buses LB and $\overline{LB}$ attain a L level. This causes error detection circuit 75 to provide an error flag EF to end the testing.

When all the test data read but to bit line pair BL, $\overline{BL}$ of the odd number order are correct, the error flag EF is not provided from error detection circuit 75 of read/test circuit 7a.

If there is at least one error in the test data read out from the bit line pair BL, $\overline{BL}$ of the even number order belonging to the second group, the potentials of read buses R2, and $\overline{R2}$ similarly attain a L level. This causes error detection circuit 75 of read/test circuit 7b to provide an error flag EF to end the test.

When the test data stored in the memory cells MC connected to the first word line WL are all read out correctly, error flag EF is not provided from read/test circuits 7a and 7b. Then the potential of word line WL drops to a L level.

Testing of one row of memory cells MC associated with the first word line WL is carried out by one cycle with the above described read out operation. The above operation is sequentially repeated for the second word line, the third word line, . . . .

It is determined that data of all memory cells MC are read out correctly if an error flag EF is not provided when the line mode testing of all word lines are completed, whereby the chip is regarded to "pass" testing.

Figure 6:
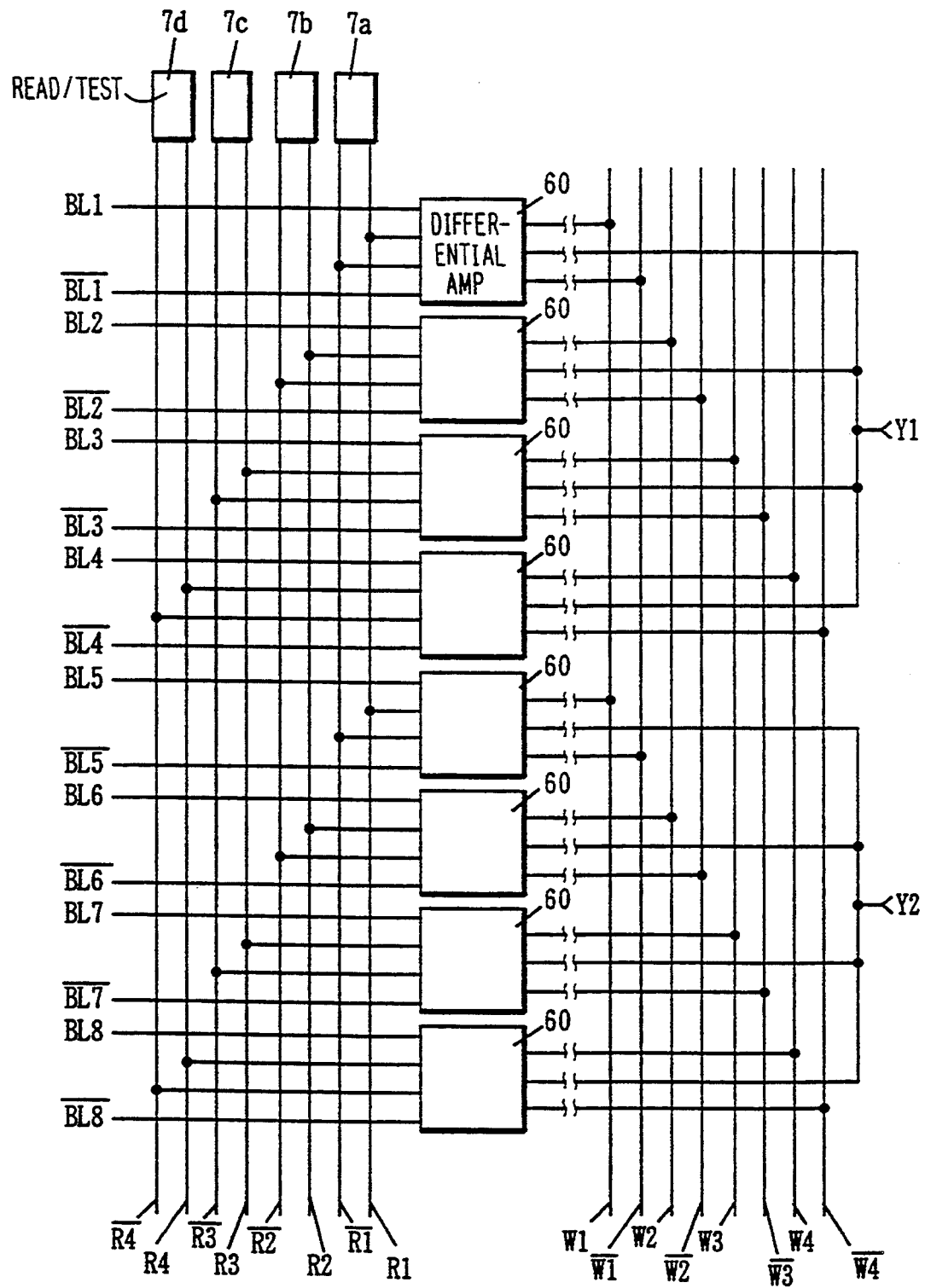
FIG. 6 shows a structure of the main components of a semiconductor memory device according to another embodiment of the present invention.

FIG. 6 shows a structure of a semiconductor memory device according to another embodiment of the present invention.

A plurality of bit line pairs is divided into four groups in the embodiment of FIG. 6. The 4k+1st bit line pair belongs to the first group, the 4k+2nd bit line pair belongs to the second group, the 4k+3rd bit line pair belongs to a third group, and the 4k+4th bit line pair belongs to the fourth group, where k=0, 1, 2, . . . . Four pairs of write buses W1, $\overline{W1}$-W4, $\overline{W4}$, four pairs of read buses R1, $\overline{R1}$-R4, $\overline{R4}$, and four pairs of read/test circuits 7a, 7b, 7c and 7d are provided corresponding to the 1st to 4th groups.

Column selecting signal Y1 is applied to the first differential amplifier 60 corresponding to bit line pairs BL1, $\overline{BL1}$-BL4, $\overline{BL4}$. Column selecting signal Y2 is supplied to the first differential amplifier 60 corresponding to bit line pairs BL5, $\overline{BL5}$-BL8, $\overline{BL8}$.

When a test data of H is applied to write buses W1, $\overline{W1}$, W2, $\overline{W2}$, and a test data of L is applied to write buses W3, $\overline{W3}$ and W4, $\overline{W4}$, test data differing by every two bits are written. That is to say, test data H, H, L, L, . . . are written into the memory cells MC connected to the selected one word line WL.

Figure 7:
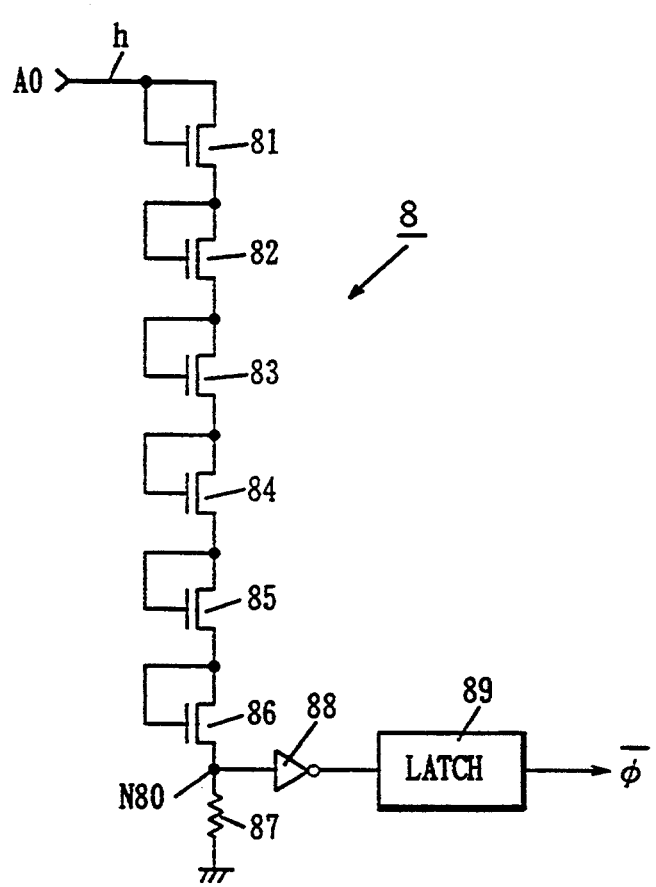
FIG. 7 is a circuit diagram showing a structure of a high-voltage detector.

FIG. 7 is a circuit diagram showing a structure of a high-voltage detector 8 of the semiconductor memory device of FIG. 1.

N channel MOS transistors 81–86 are connected between an input terminal h for address signal A0 and node N80. A resistor 87 is connected between node N80 and the ground line. Node N80 is connected to latch circuit 89 via inverter 88.

The threshold voltages of transistors 81–86 are set to 1V, and the threshold voltage of inverter 88 is set to a half of supply voltage $V_{CC}$. When supply voltage $V_{CC}$ is 5V, the threshold voltage of inverter 88 is 2.5V.

If a voltage of 10V is applied to input terminal h for address signal A0, a voltage reduced by 6V, i.e. a voltage of 4V appears at node N80. Therefore, inverter 88 regards the signal of node N80 as a H level to provide a voltage of a L level.

The output of inverter 88 is latched by latch circuit 89 because input terminal h is used to apply address signal A0. The output signal of latch circuit 89 is used as a test enable signal $\bar{\phi}$.

At the time of normal operation, input terminal h is applied with address signal A0 of 0V–7V. An application of address signal A0 of 7V to input terminal h generates a voltage of 1V at node N80. This voltage is determined as a L level by inverter 88, whereby test enable signal $\bar{\phi}$ attains a H level.

Thus, test enable signal $\bar{\phi}$ attains a H level at the time of normal operation, and a L level at the time of line mode testing.

Figure 8:
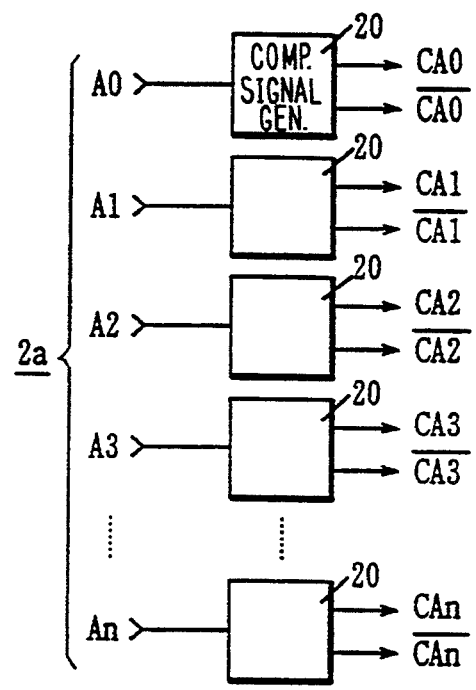
FIG. 8 shows a structure of a column address buffer.

FIG. 8 is a block diagram showing a structure of column address buffer 2a included in address buffer 2 of the semiconductor memory device of FIG. 1.

Column address buffer 2a comprises a plurality of complementary signal generating circuits 20. Each complementary signal generating circuit 20 receives an address signal Aj to generate column address signals CAj, $\overline{CAj}$ complementary to each other. j represents 0–n.

Figure 9:
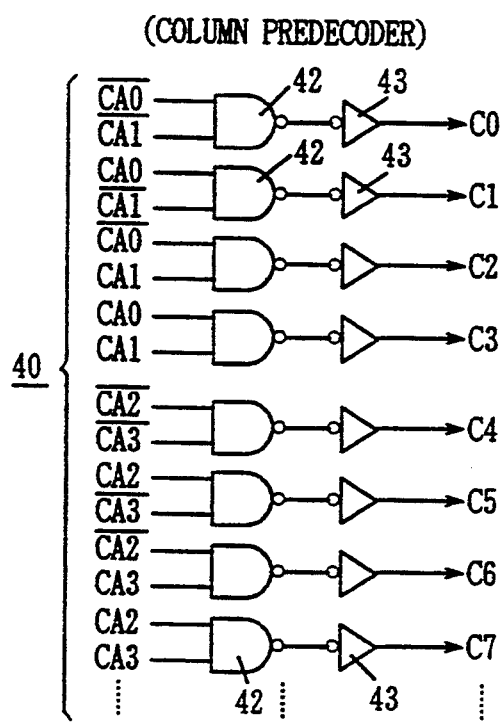
FIG. 9 is a circuit diagram showing the structure of a column predecoder.
Figure 10:
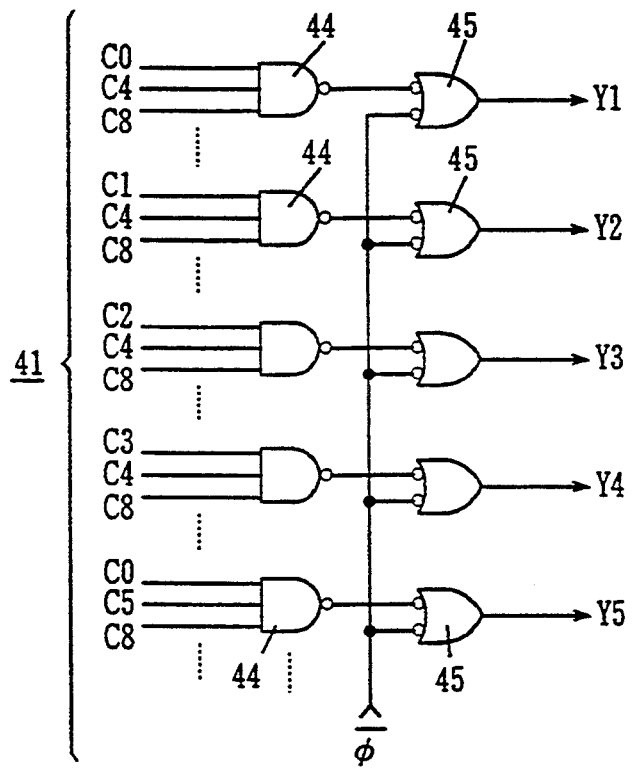
FIG. 10 is a circuit diagram showing a structure of a column main decoder.

FIGS. 9 and 10 are circuit diagrams showing the structure of the column decoder 4 of the semiconductor memory device of FIG. 1. Column decoder 4 comprises a column predecoder 40 shown in FIG. 9 and a column main decoder 41 shown in FIG. 10.

Column predecoder 40 comprises a plurality of NAND gates 42 and a plurality of inverters 43. Each NAND gate 42 is supplied with two of column address signals CA0, $\overline{CA0}$–CAn, $\overline{CAn}$. Signals C0, C1, C2, . . . are provided from inverter 43. Column predecoder 40 is responsive to the input column address signal to bring one of signals C0–C3 and one of signals C4–C7 to a H level.

Column main decoder 41 comprises a plurality of NAND gates 44 and a plurality of NAND gates 45. Each NAND gate 45 has one input terminal supplied with test enable signal $\bar{\phi}$. When test enable signal $\bar{\phi}$ is at a H level, column main decoder 41 is responsive to signals C0, C1, C2, . . . to bring one of column selecting signals Y1, Y2, . . . to a H level. When test enable signal $\bar{\phi}$ is at a L level, column main decoder 41 brings all column selecting signals Y1, Y2, . . . to a H level, regardless of signals C0, C1, C2 . . . .

There are also the methods of bringing all column selecting signals Y1, Y2, . . . to a H level at the time of line mode testing by providing test enable signal $\bar{\phi}$ to column predecoder 40 of FIG. 9, and of bringing all column address signals CAj, $\overline{CAj}$ to a H level by providing test enable signal $\bar{\phi}$ to column address buffer 2a of FIG. 8.

Figure 11:
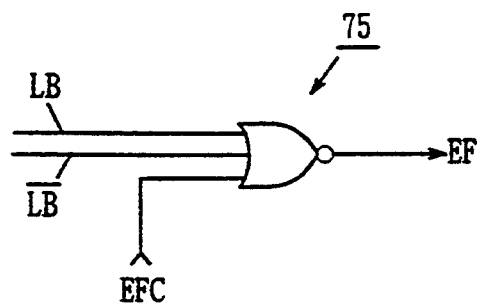
FIG. 11 is a circuit diagram showing the structure of an error detection circuit.

FIG. 11 is a structure of an error detection circuit 75 of FIG. 2.

Error detection circuit 75 is implemented with a 3-input NOR gate. NOR gate has the first input terminal connected to line test bus LB, and the second input terminal connected to line test bus $\overline{LB}$. The third input terminal is supplied with an error flag control signal EFC. Error flag control signal EFC attains a L level only when error checking is carried out in line mode testing. An error flag EF of a H level is provided from NOR gate 75 when an error is detected.

Figure 12:
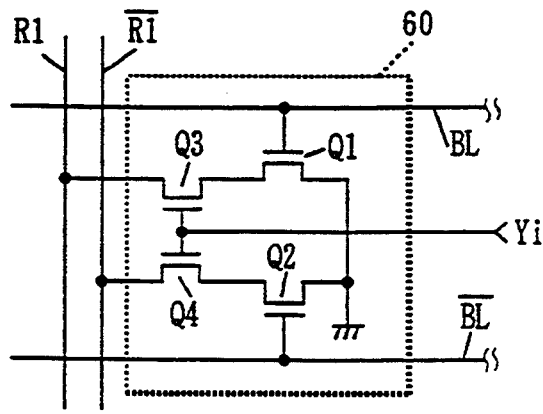
FIG. 12 is a circuit diagram showing another example of a first differential amplifier.

FIG. 12 is a circuit diagram of another example of the first differential amplifier 60. In comparison with the first differential amplifier 60 of FIG. 2, the positions of transistors Q1 and Q2 connected to bit line pair BL, $\overline{BL}$, and transistors Q3, Q4 receiving column selecting signal Yi are replaced with each other. According to the structure of FIG. 12, column selecting signal Yi can be rendered to a H level, after the voltage amplitude between bit line pair BL, $\overline{BL}$ is large enough at the time of normal operation. It is therefore possible to rapidly drop one potential of read buses R1 or $\overline{R1}$ to a L level according to relating stray capacitance.

Figure 13:
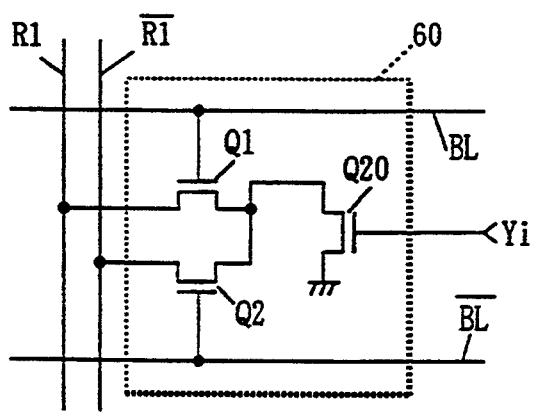
FIG. 13 is a circuit diagram showing a further example of a first differential amplifier.

FIG. 13 is a circuit diagram showing a further example of the first differential amplifier 60. In comparison with the first differential amplifier 60 of FIG. 2, one transistor Q20 is used instead of the two transistors Q3, Q4 receiving the column selecting signal Yi. This means that the number of devices is reduced. However, if there is fault in bit line pair BL, $\overline{BL}$ so that bit line BL and bit line $\overline{BL}$ are short-circuited, both transistors Q1 and Q2 are turned on, whereby read buses R1 and $\overline{R1}$ are connected to each other via transistor Q1 and Q2. It will become impossible to carry out line mode testing even if the faulty bit line pair BL, $\overline{BL}$ is replaced by a redundant circuit.

Figure 14:
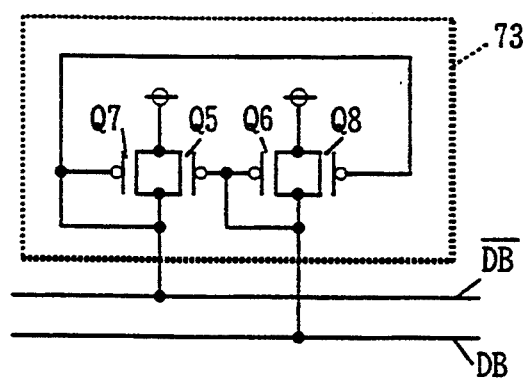
FIG. 14 is a circuit diagram showing another example of a second differential amplifier.

FIG. 14 is circuit diagram showing another example of the second differential amplifier 73. This second differential amplifier 73 is called a symmetric type differential amplifier.

This second differential amplifier 73 is additionally provided with a P channel MOS transistor Q7 connected in parallel with transistor Q5, and a P channel MOS transistor Q8 connected in parallel with transistor Q6. This can improve the operation characteristic during normal operation, as will be described later on.

Figure 15:
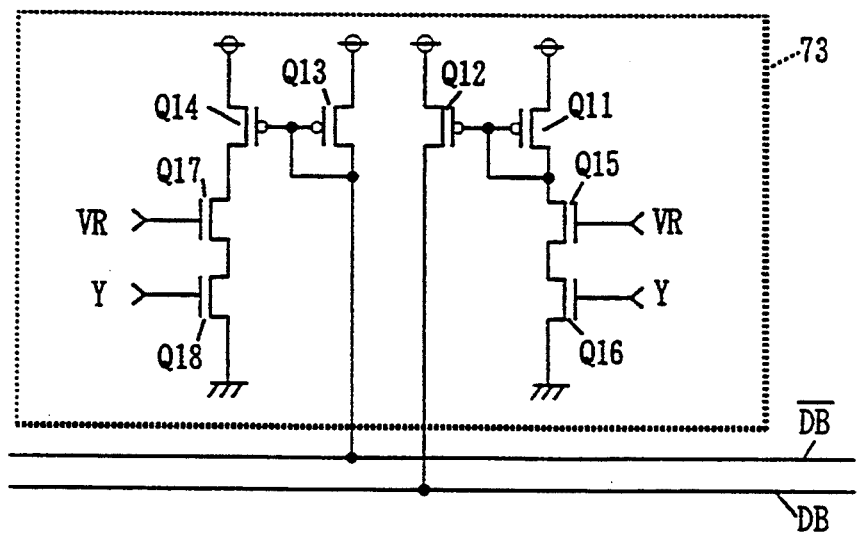
FIG. 15 is a circuit diagram showing a further example of a second differential amplifier.

FIG. 15 is a circuit diagram showing another example of the second differential amplifier 73. This second differential amplifier 73 is called a double differential amplifier.

The second differential amplifier 73 of FIG. 15 is constituted by a first differential amplifier comprising P channel MOS transistors Q11, Q12 and N channel MOS transistors Q15 and Q16, and a second differential amplifier comprising P channel MOS transistors Q13, Q14 and N channel MOS transistors Q17, and Q18. The first differential amplifier is connected to data bus DB, and the second differential amplifier is connected to data bus $\overline{DB}$.

The gates of transistors Q15 and Q17 are supplied with a reference voltage VR. Reference voltage VR is set to ½ of supply voltage $V_{CC}$. The gates of transistors Q16 and Q18 are supplied with activation signal Y. Activation signal Y is brought to a H level when one of column selecting signals Yi attains a H level. According to the structure of FIG. 15, sensitivity rises to improve the operation characteristic of normal operation.

Figure 16:
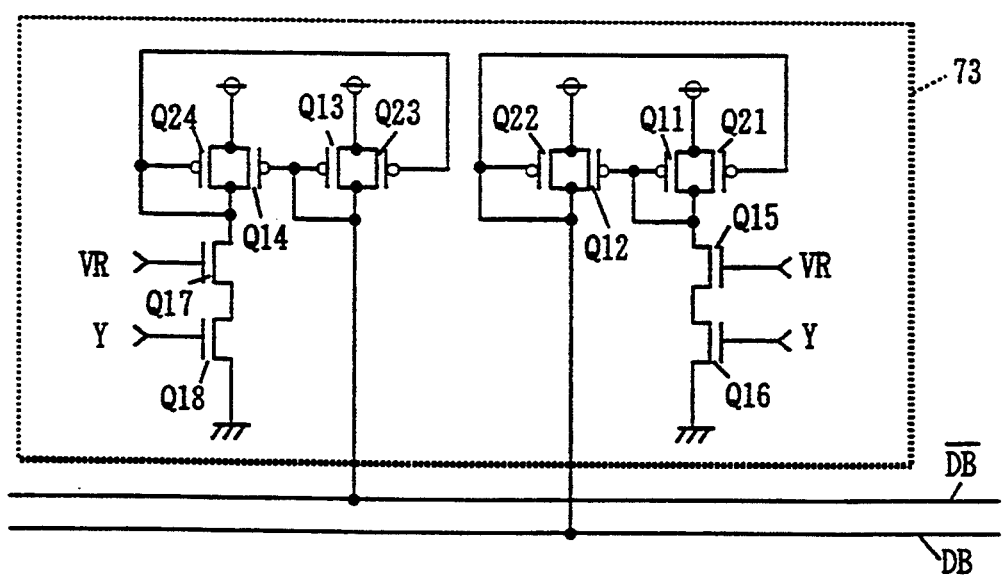
FIG. 16 is a circuit diagram of a still further example of a second differential amplifier.

FIG. 16 is a circuit diagram showing a still further example of the second differential amplifier 73. The differential amplifier 73 of FIG. 16 is a combination of the symmetric type differential amplifier of FIG. 14 and the double differential amplifier of FIG. 15. This second differential amplifier 73 is called a double symmetric type differential amplifier.

In comparison with the second differential amplifier 73 of FIG. 15, P channel MOS transistors Q21-Q24 are provided additionally.

According to this structure, the advantages of both the symmetric type differential amplifier and the double differential amplifier are obtained.

The difference in characteristics between an asymmetric differential amplifier and a symmetric type differential amplifier will be described hereinafter.

Figure 17:
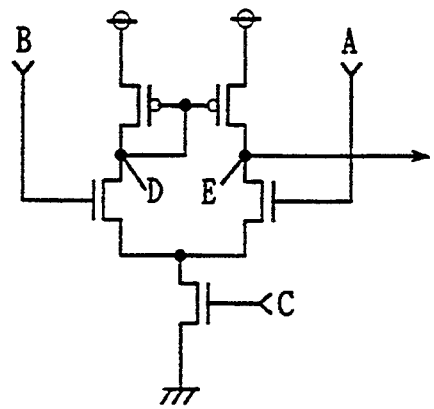
FIG. 17A shows a structure of an asymmetric type differential amplifier.
FIG. 17B is a waveform chart for explaining the characteristic of the asymmetric type differential amplifier.
Figure 17:
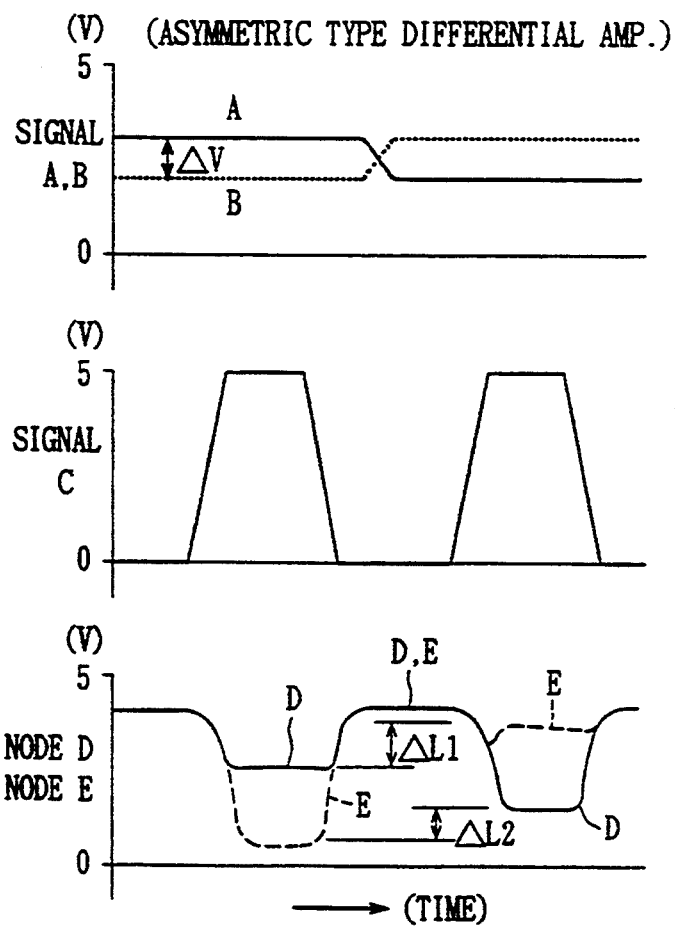

FIG. 17A shows a structure, and FIG. 17B shows a waveform chart of an asymmetric differential amplifier. FIG. 18A shows a structure, and FIG. 18B shows a waveform chart of a symmetric differential amplifier.

The characteristics will be compared when activation signal C becomes H with a potential difference of ΔV between signal A and signal B. In the asymmetric type differential amplifier, there is a potential difference of ΔL1 between a H level potential of node D and a H level potential of node E, and a potential difference of ΔL2 between a L level potential of node E and a L level potential of node D. In the symmetric type differential amplifier, there is no potential difference between the H level potential of node D and the H level potential of node E, and between the L level potential of node E and the L level potential of node D.

Testing by field patterns and march testing will be explained hereinafter.

Various examples of field patterns are shown in FIGS. 19-24. FIG. 19 is a row stripe field pattern, FIG. 20 is a checker pattern board field pattern, FIG. 21 a 2-row stripe field pattern, FIG. 22 is a 2-column checker pattern, FIG. 23 is a double checker field pattern, and FIG. 24 is a column stripe field pattern.

Field pattern testing is carried out by writing test data according to the field pattern into a memory array, followed by reading out the test data.

Operational margins such as interference between memory cells, noise between word lines, noise between bit lines, noise between sense amplifiers can be checked by field pattern testing.

The embodiment of FIG. 6 allows line mode testing using the various field patterns of FIGS. 19-24 by providing appropriate test data according to the field pattern to a plurality of write buses. It is possible to test one row of memory cells in one read out cycle using any of the field patterns.

The embodiment of FIG. 2 allows line mode testing using the field patterns of FIGS. 19 to 23 and 24.

In testing by field patterns, there is a possibility that error in an address system, for example, may not be detected because the patterns exist in a periodic manner. In such a case, it is necessary to carry out the next march testing.

Figure 25:
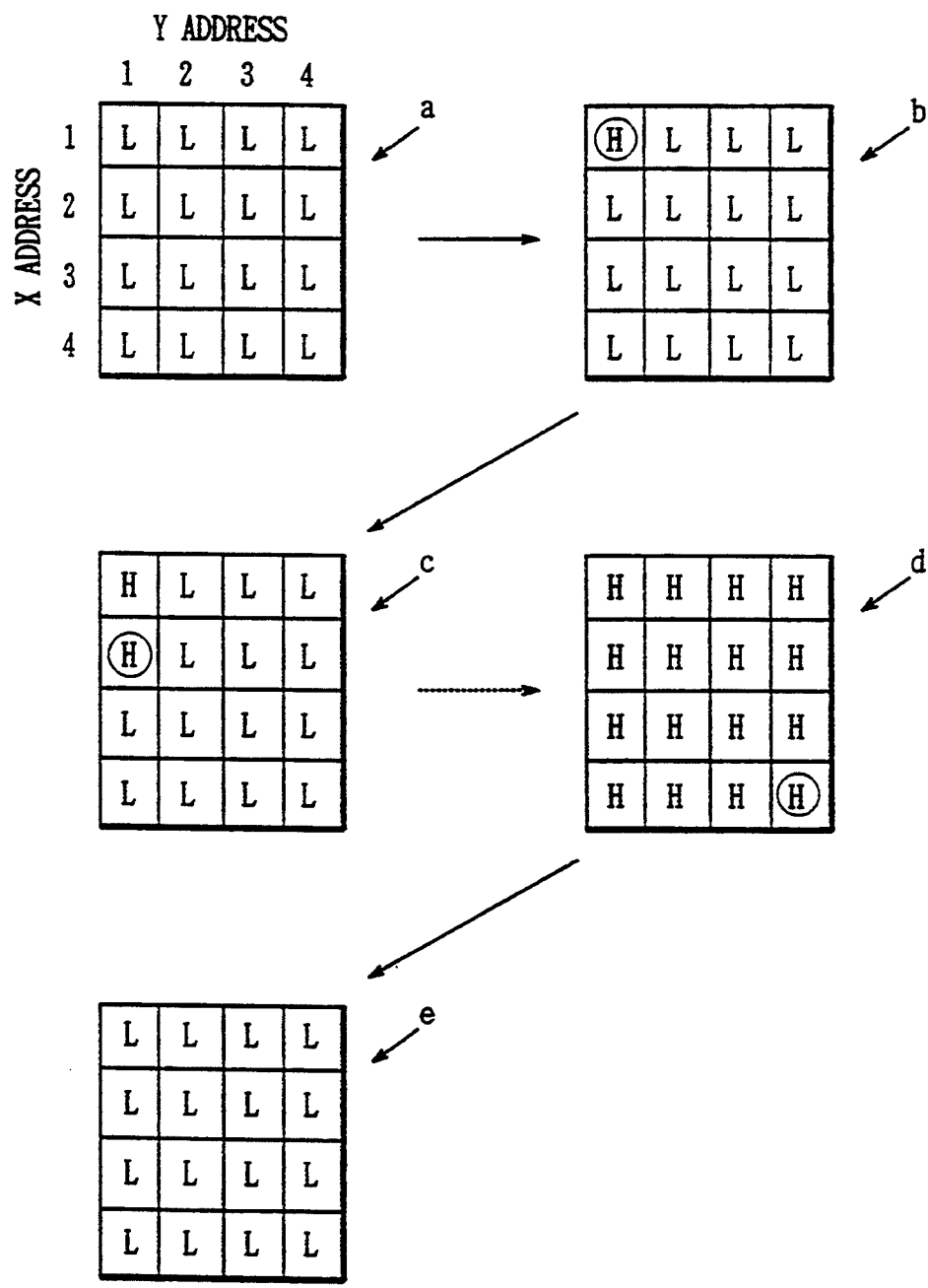
FIG. 25 is a model diagram for explaining a march test.

FIG. 25 is a diagram for explaining the march test.

An example of a march test of a 4×4 (=16) bit-memory array is shown in FIG. 25.

In a, test data of L is written into all addresses as the background data.

In b, test data of L is read out from X address 1 and Y address 1, and test data of H is written into the same addresses.

In c, test data of L is read out from X address 2 and Y address 1, and test data of H is written into the same addresses.

The address of X address is sequentially increased and the above operation is repeated. When the above operation is completed for the 4 addresses of X address, the address of Y address is increased by 1 and the above operation is repeated while the address of X address is increased by 1 sequentially.

In d, test data of L is read out from X address 4 and Y address 4, and test data of H is written into the same addresses.

Increasing the addresses of X address and Y address as in the above manner, test data of H is read out and test data of L is written. This is repeated for all addresses.

Test data of L is written into all addresses as shown in e. Then, test data of L of all the addresses are read out.

An operation similar to the above operation is carried out decreasing the addresses of X address and Y address.

This march test is necessary to examine whether addresses are selected correctly.

In the semiconductor memory device of the above mentioned embodiment, a test similar to the march test can be carried out. This pseudo march test is described with reference to FIG. 26 that can be carried out according to the embodiment of FIG. 6.

Figure 26:
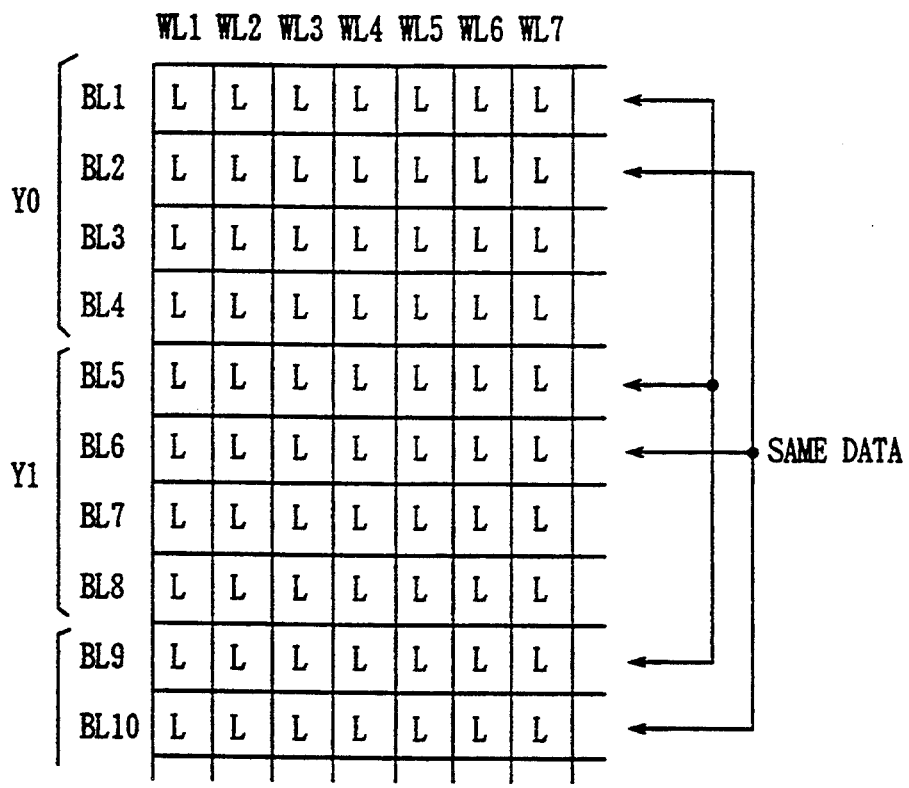
FIG. 26 is a model diagram for explaining a pseudo march test.

Referring to FIG. 26, reading and writing of the same test data is carried out for every 4 bits of Y address. It is necessary to differentiate the test data within the four addresses of Y address selected at the same time.

After test data of L is written in all addresses, X address WL1 is selected. Expected data of L is applied to Y addresses BL1-BL10, followed by reading out test data of L from those addresses. Next, test data of H is written to only Y addresses BL1, BL5 and BL9, and test data of L is written into Y addresses BL2-BL4, BL6-BL8, BL10.

After increasing the X address, the above mentioned reading and writing operation is carried out. When this operation is completed with the last X address, X address is returned to WL1. Expected data of H is applied to Y addresses BL1, BL5 and BL9, and expected data of L is applied to Y addresses BL2-BL4, BL6-BL8 and BL10. Test data is read out from these addresses. Then, test data of H is written into Y addresses BL1, BL2, BL5, BL6, BL9, and BL10, and test data of L is written into Y addresses BL3, BL4, BL7 and BL8.

X address is increased, and the above read and write operations are repeated.

Similarly, expected data of H is applied to Y addresses BL1, BL2, BL5, BL6, BL9, BL10, and expected data of L is written into Y addresses BL3, BL4, BL7, BL8. Test data is read out from these addresses. A test locally equal to a march test can be carried out in the above manner.

Thus, testing time can be reduced significantly even in pseudo march test which was not effective in conventional line mode testing using a plurality of latch circuits.

Figure 27:
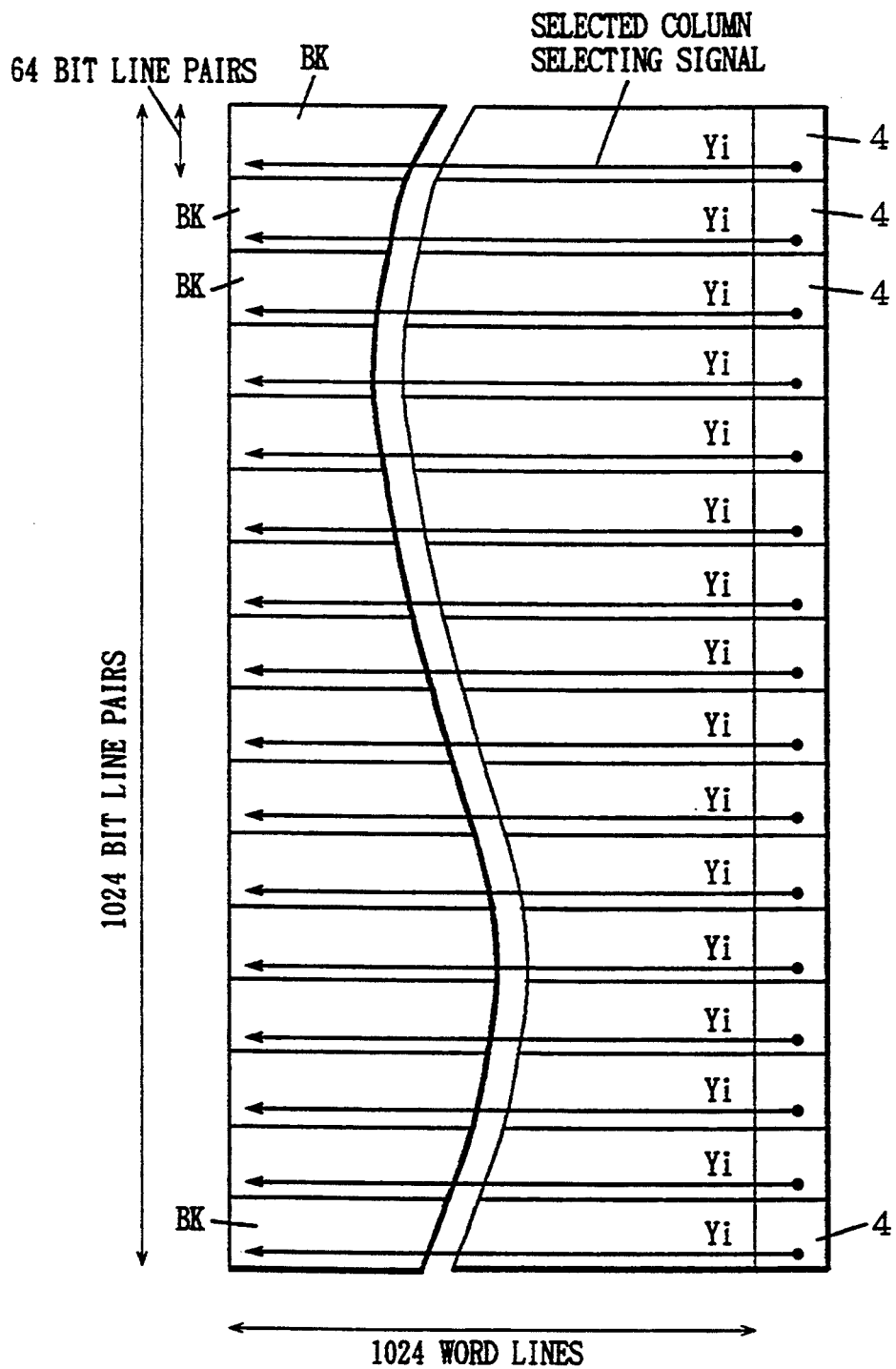
FIGS. 27 and 28 are model diagrams showing a memory array divided into a plurality of block arrays.
Figure 28:
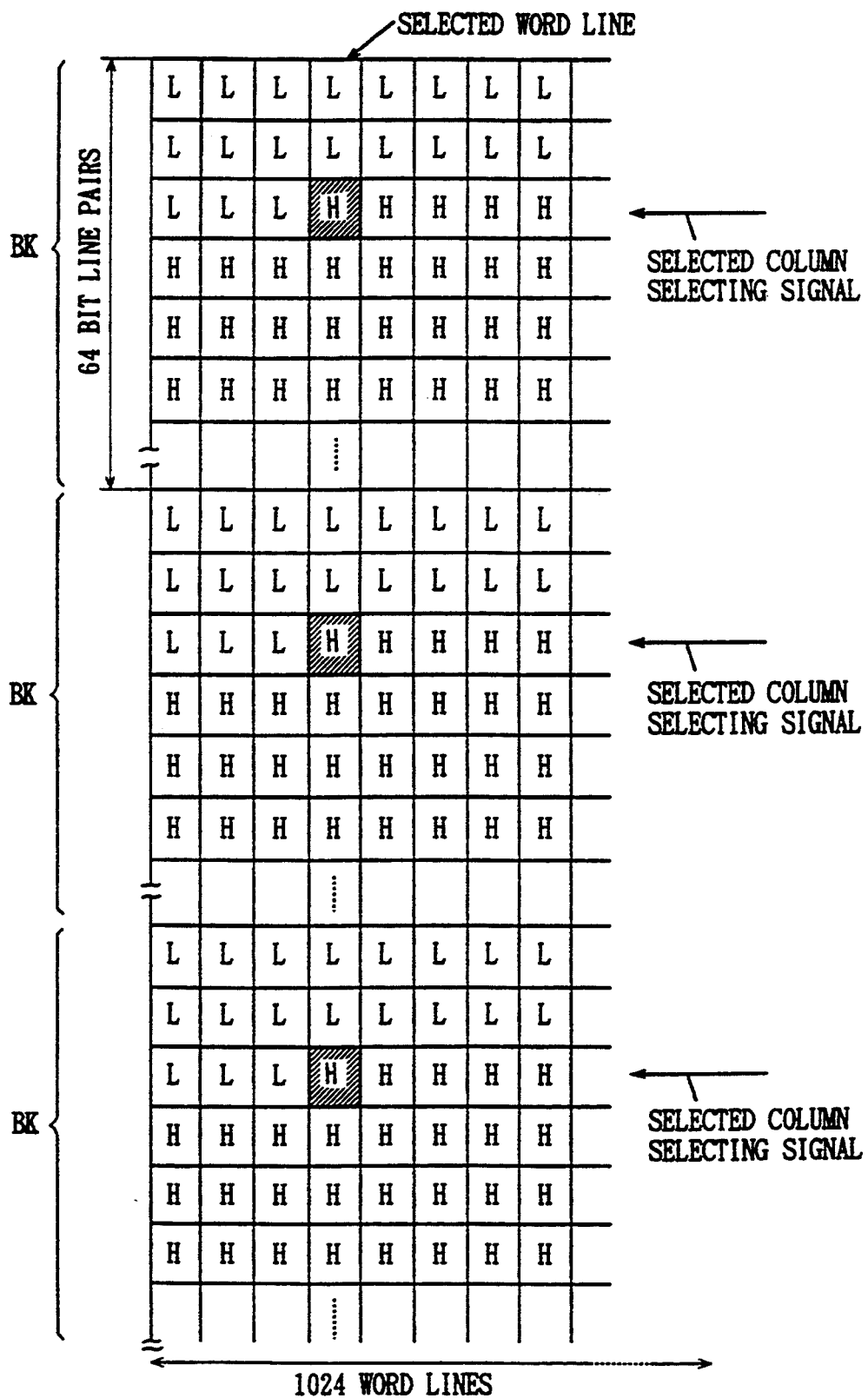

FIGS. 27 and 28 show an example where a memory array is divided into 16 block arrays BK.

The memory array comprises 1024 bit line pairs and 1024 word lines, with a capacity of 1M bit. Each block array BK comprises 64 bit line pairs. One column selecting signal Yi is activated within one block array BK. Therefore sixteen memory cells can be tested simultaneously. The testing of all the memory array is completed by carrying out a march test in each block array BK. Thus the march testing time can be reduced to 1/16.

Figure 29:
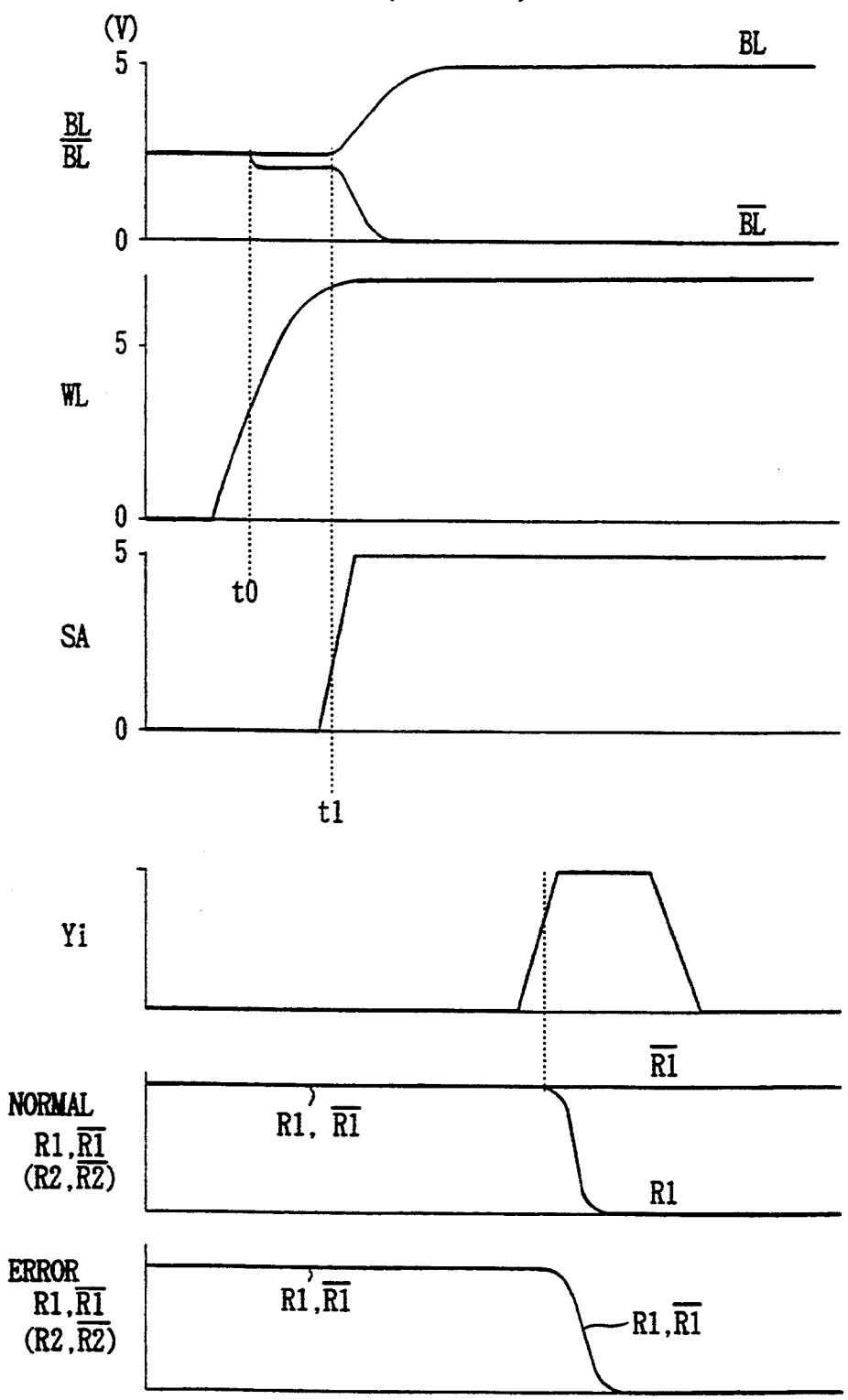
FIG. 29 is a waveform chart for explaining other operations of the semiconductor memory device of FIGS. 1 and 2.

Referring to FIG. 29, other operations of the semiconductor memory device of FIGS. 1 and 2 will be explained hereinafter.

Read buses R1, $\overline{R1}$ and R2, $\overline{R2}$ are precharged to the H level. For example, if a H test data is properly read into all the bit line pairs BL, $\overline{BL}$ of the odd number order belonging to the first group, each first differential amplifier 60 connected to read buses R1, $\overline{R1}$ have transistor Q1 thereof turned on and transistor Q2 thereof turned off. When all of the column selecting signals Yi rise to the H level, read bus $\overline{R1}$ is discharged to the L level, and read bus R1 is not discharged, so that the potential thereof is maintained at the H level.

If there is an error in one of the bit line pairs BL, $\overline{BL}$ of the odd number order belonging to the first group, for example, the potential of bit line $\overline{BL}$ that should be at the L level attains the H level or an intermediate level. Therefore transistor Q2 that should be turned off is ON. This causes both read buses R1, $\overline{R1}$ to be discharged to the L level.

It is detected that all data are read out properly when a plurality of data read out simultaneously all matched each other. It is detected that there is an error when any of the plurality of data read out simultaneously does not match the other data.

Read buses R1, $\overline{R1}$ and R2, $\overline{R2}$ are supplied with a data corresponding to the data to be read out, as an expected data. It is necessary to know in advance whether the data stored in each address is H or L in order to determine the expected data. It is also necessary to write the expected data corresponding to each address into the read bus. As a result, the test operation becomes complicated.

In the above method, only the information that the same data is stored for every other memory cell is required in advance. It is not necessary to provide the expected data to the read bus by the expected data writing circuit 74. As a result, it is possible to carry out testing easily.

Figure 30:
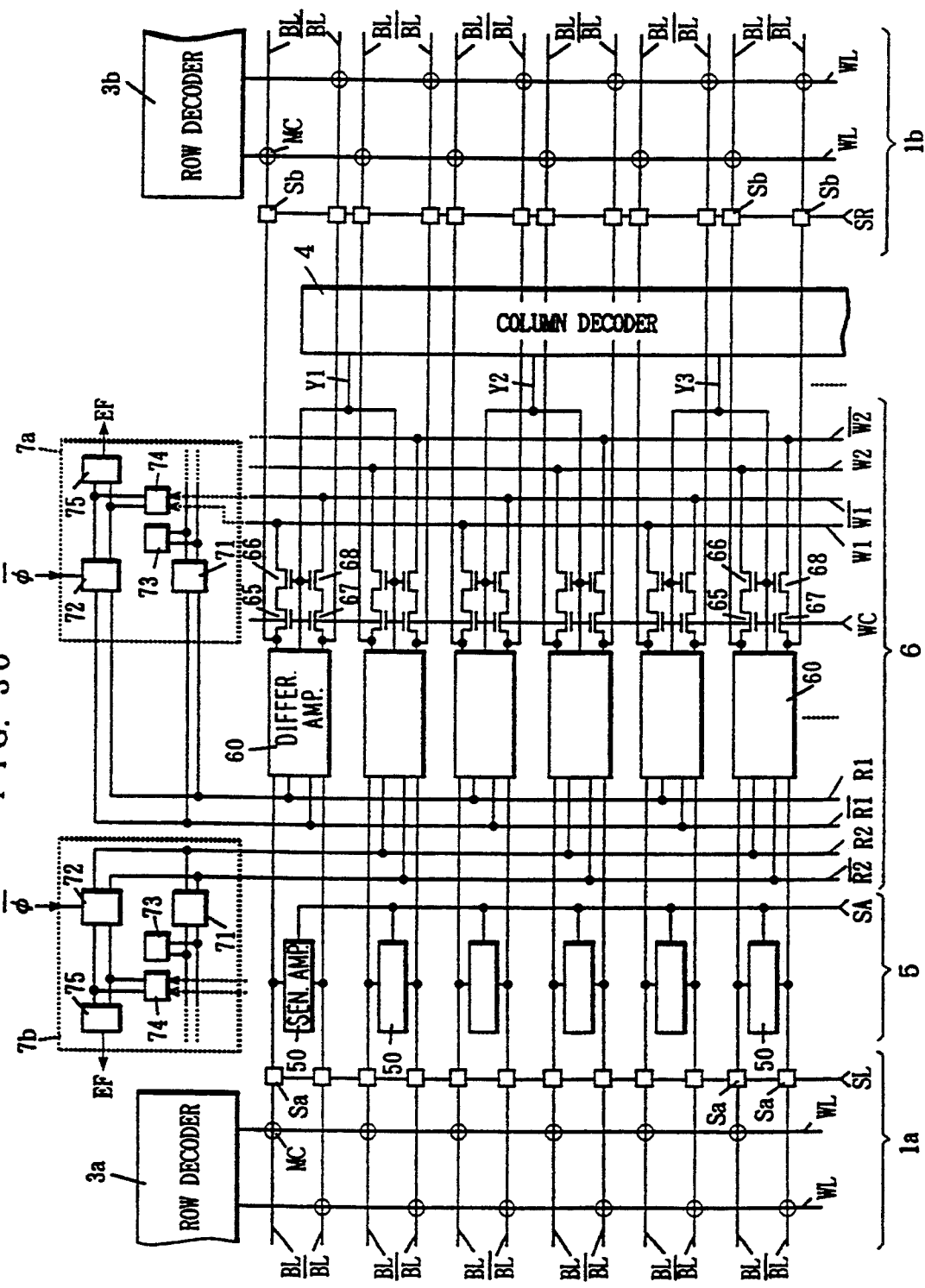
FIG. 30 is a circuit diagram of the structure of the main components of a semiconductor memory device according to another embodiment of the present invention.

FIG. 30 is a circuit diagram showing the structure of the main components of the semiconductor memory device according to a further embodiment of the present invention. This semiconductor memory device comprises a shared sense amplifier structure including two memory array blocks 1a and 1b. Memory array blocks 1a and 1b share sense amplifier group 5 and read/write gates 6. Each bit line pair BL, $\overline{BL}$ in memory array block 1a is connected to the corresponding sense amplifier 50 and the corresponding first differential amplifier 60 via switch Sa. Each bit line BL, $\overline{BL}$ in memory array block 1b is connected to the corresponding sense amplifier 50 and the corresponding first differential amplifier 60 via switch Sb. One of switches Sa and Sb is selectively turned on by switch signals SL and SR.

According to the present embodiment, only one set of sense amplifier group 5 and one set of read/write gates 6 are required for the two memory array blocks 1a and 1b. This reduces the layout area. The present embodiment is particularly advantageous to reduce the layout area because sense amplifier group 5 and read/write gates 6 occupy a large area.

Figure 31:
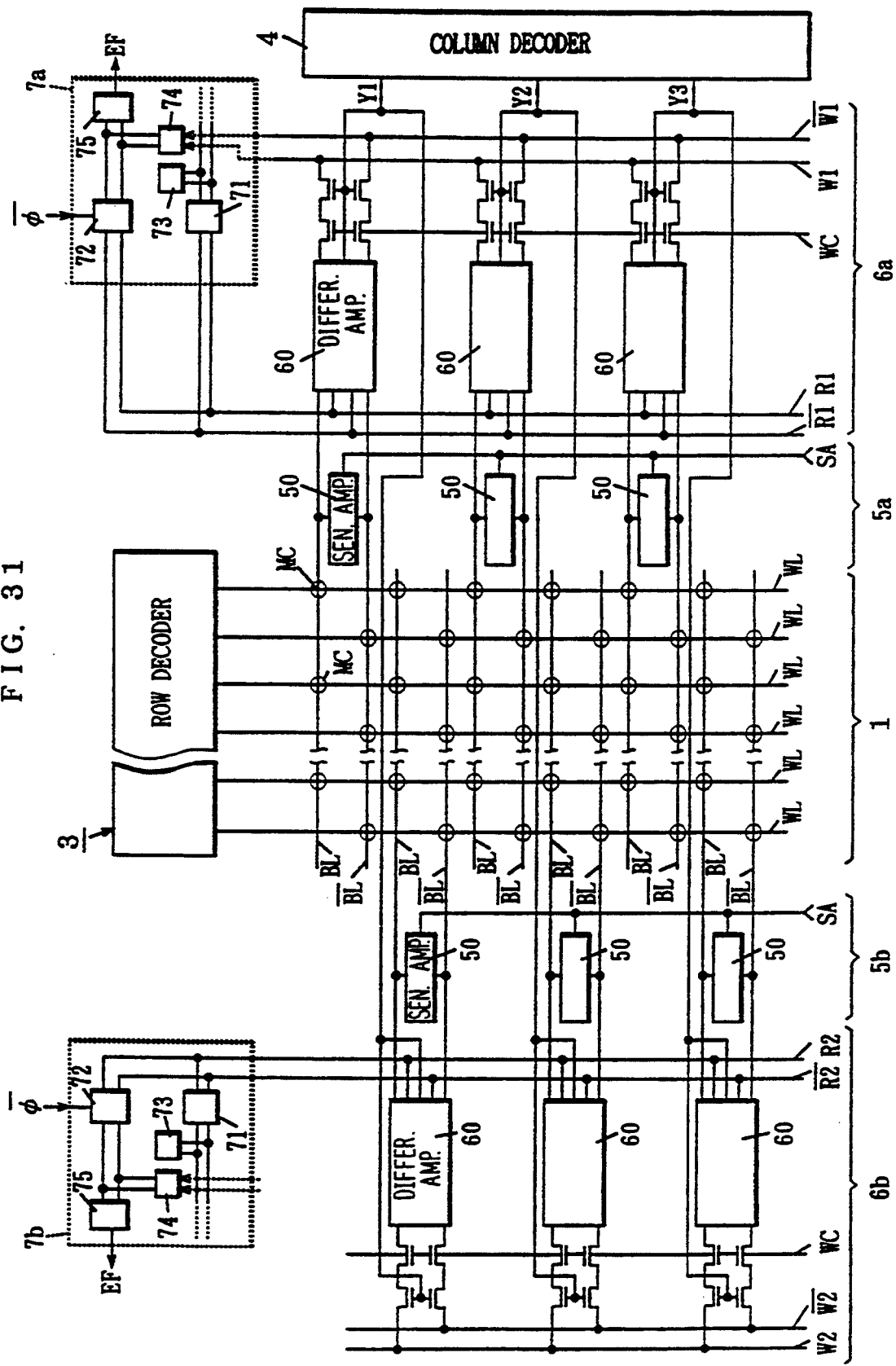
FIG. 31 is a circuit diagram of the structure of the main components of a semiconductor memory device according to a further embodiment of the present invention.

FIG. 31 is a circuit diagram of the structure of the main components of the semiconductor memory device according to a still further embodiment of the present invention.

The semiconductor memory device comprises an alternate arrangement type array (alternate arrangement type sense amplifier) structure. This semiconductor memory device differs from the semiconductor memory device of FIG. 1 in the following points. Sense amplifier group 5a and read/write gates 6a corresponding to the first group are provided at one side of memory array 1, and sense amplifier group 5b and read/write gates 6b corresponding to the second group are provided at the other side of memory array 1. The width of each sense amplifier 50 and the width of each first differential amplifier 60 can be doubled in comparison with the distance between each bit line pair BL, $\overline{BL}$ to obtain easier layout.

The embodiment of FIG. 30 can be combined with that of FIG. 31.

According to the embodiment of FIG. 31, a column disturb test which will be explained hereinafter can be carried out easily.

Figure 32:
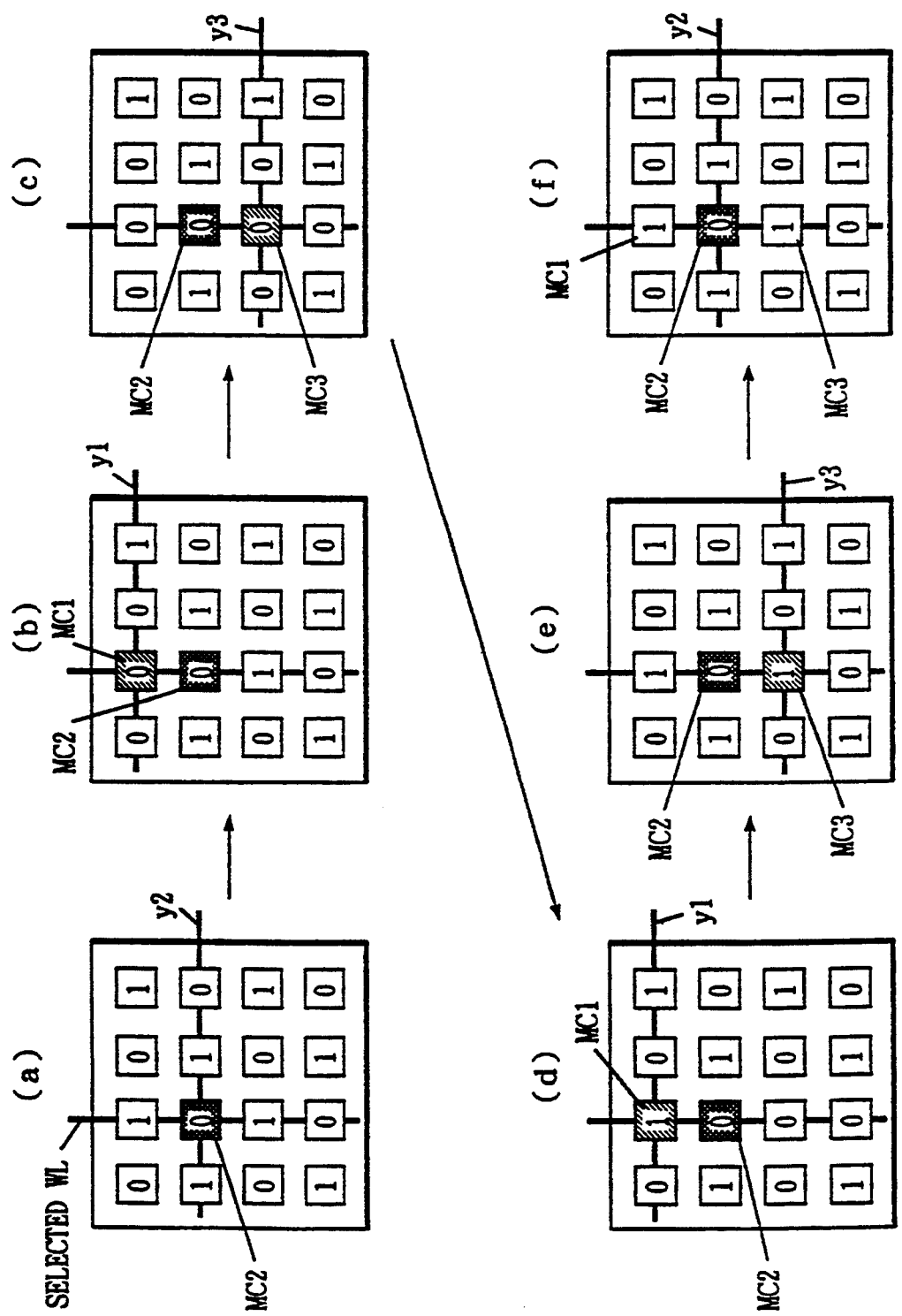
FIG. 32 is a diagram for explaining the normal flow of a column disturb test.

FIG. 32 is a diagram for explaining the normal flow of the column disturb test.

First, data 0 is written into the observed memory cell MC2 connected to column selecting line y2 (FIG. 32 (a)). Data 0 is written into memory cell MC1 connected to one adjacent column selecting line y1 (FIG. 32 (b)). Data 0 is written into memory cell MC3 connected to the other adjacent column selecting signal y3 (FIG. 32 (c)). Then, data 1 is written into memory cell MC1 connected to the other adjacent column selecting line y1 (FIG. 32 (d)). Data 1 is written into memory cell MC3 connected to the other adjacent column selecting line y3 (FIG. 32 (e)). Data 0 stored in memory cell MC2 is read out (FIG. 32 (f)).

In the column disturb test, data opposite to that of the observed cell is written into the memory cells at both sides of the observed memory cell. By inducing disturb to the observed memory cell, a check is made whether there is change or not in the data stored in the observed memory cell. In the normal flow of the column disturb test, six cycles are necessary to provide disturb to the observed memory cell.

The column disturb test employing the embodiment of FIG. 31 will be explained hereinafter with reference to FIG. 33. 100A and 100B indicate a group of sense amplifiers and I/O gates. Since an alternate arrangement type of sense amplifiers are used, one group 100A is provided on one side of the memory cell array and another group 100B is provided on the other side of the memory cell array.

Circuit A comprises sense amplifier group 5a and read/write gates 6a corresponding to the first group. Circuit B comprises sense amplifier group 5b and read/write gates 6b corresponding to the second group.

Figure 33:
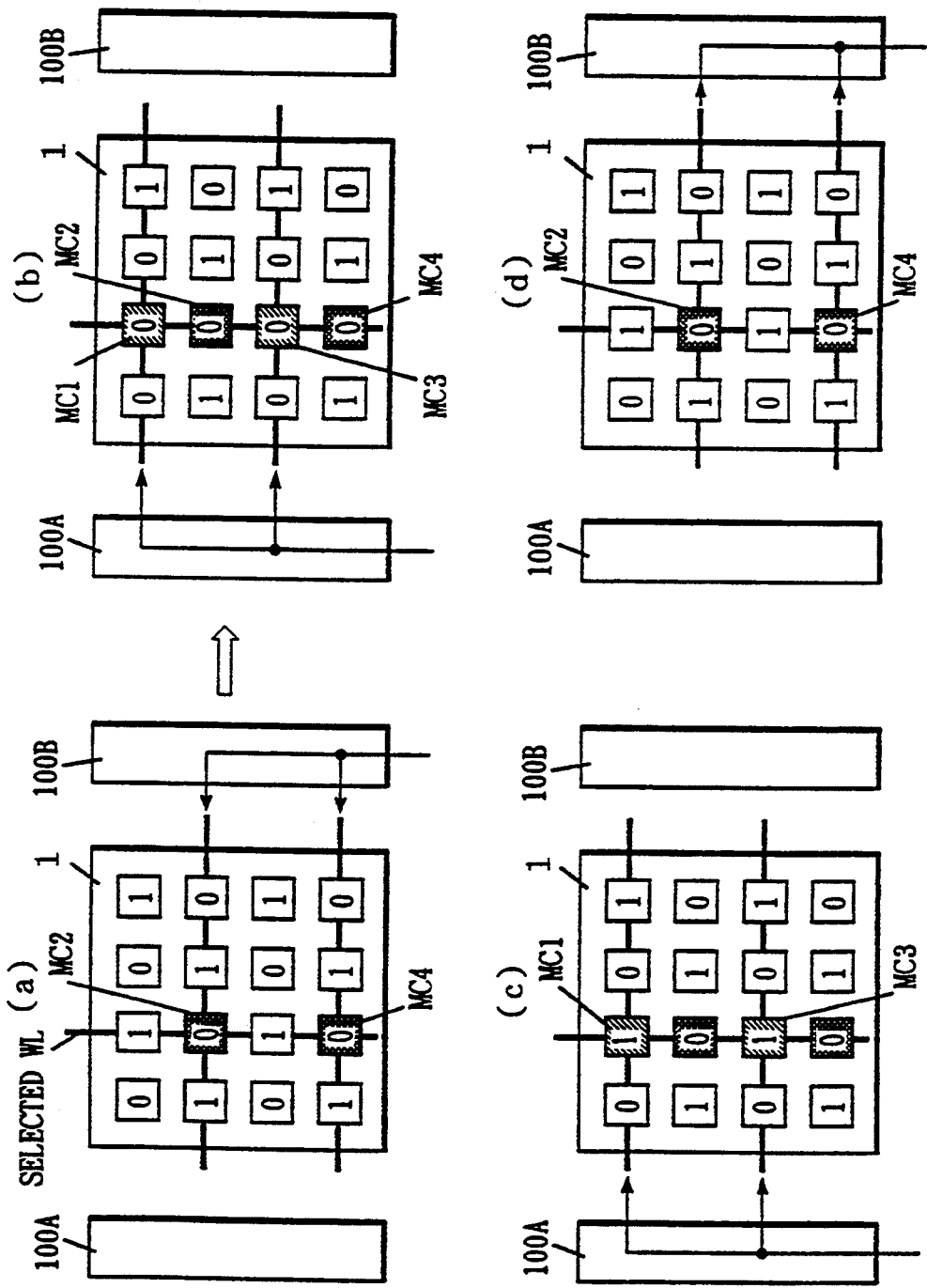
FIG. 33 is a diagram for explaining a column disturb test using the embodiment of FIG. 31.

Data 0 is written into the observed memory cells MC2 and MC4 connected to respective column selecting lines of the even number order by circuit A (FIG. 33 (a)). Data 0 is written simultaneously to memory cells MC1 and MC3 connected to respective column selecting lines of the odd number order by circuit A (FIG. 33 (b)). Data 1 is written simultaneously into memory cells MC1 and MC3 connected to respective column selecting lines of the odd number order by circuit A (FIG. 33 (c)). By circuit B, data 0 stored in observed memory cells MC2 and MC4 are read out (FIG. 33 (d)).

By using the alternate arrangement type array structure, the column selecting lines of the odd number order and the even number order can be driven by different sense amplifier groups. Therefore, it is possible to write simultaneously a disturb pattern into the memory cells at both sides of the observed memory cell. This will reduce the test sequence to allow more severe testing.

In the above example, it is possible to provide disturb simultaneously to the memory cells connected to all the column selecting lines of the even number order. This allows to carry out disturb testing in a very short time period, which previously required a long testing time period.

It is generally necessary to inactivate the sense amplifier once when writing data simultaneously to a plurality of memory cells. It is therefore necessary to divide the sense amplifier activation circuits corresponding to the column selecting lines of the odd number order and that corresponding to the column selecting lines of the even number order in different paths.

According to the above described alternate arrangement type array structure, the sense amplifier groups of the left and right sides can be automatically controlled independently. This is advantageous to the disturb test.

Figure 34:
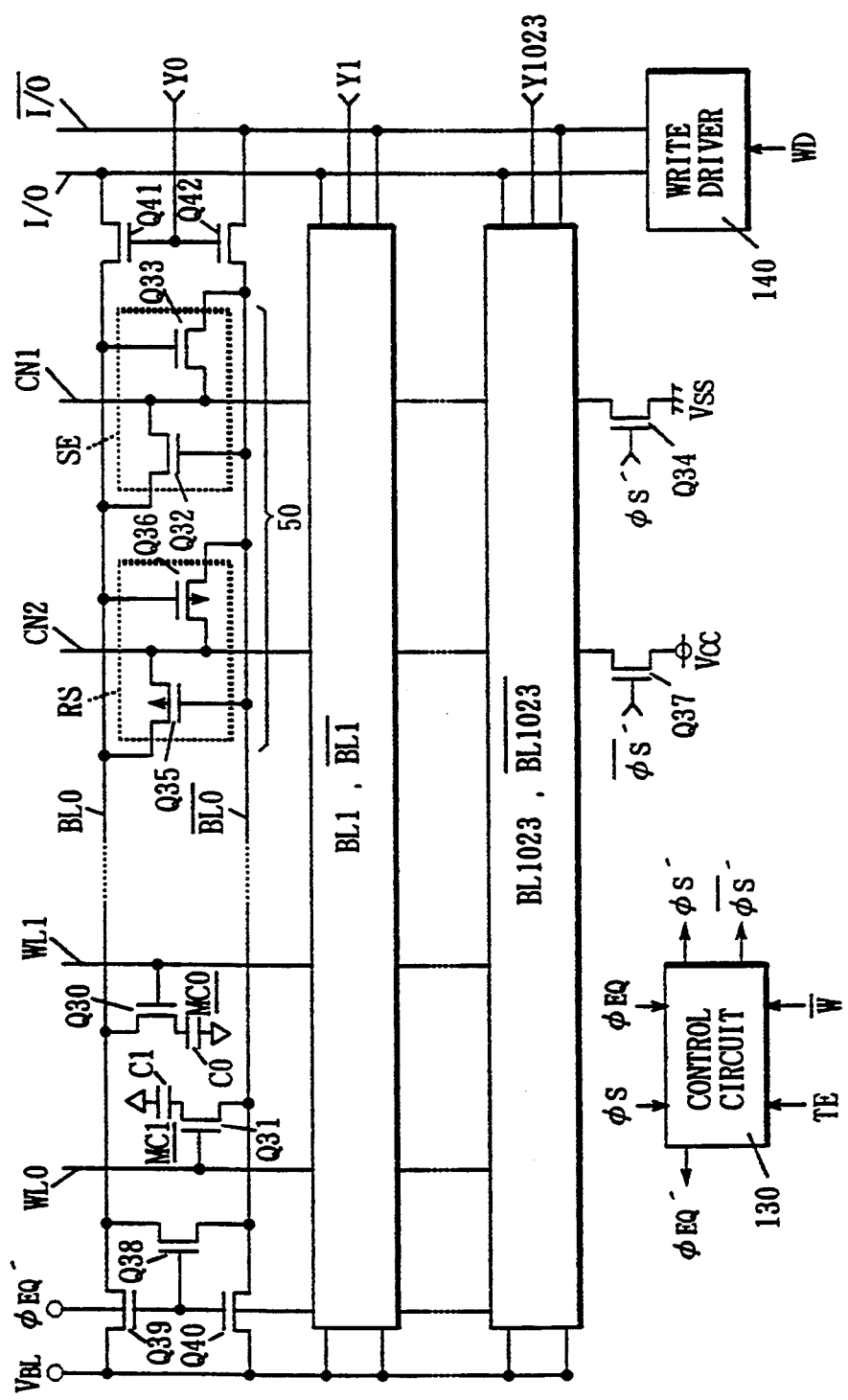
FIG. 34 is a circuit diagram showing a structure of the main components of DRAM according to a further embodiment of the present invention.

FIG. 34 is a circuit diagram showing a structure of the main components of a DRAM according to a further embodiment of the present invention.

Referring to FIG. 34, the DRAM is provided with a control circuit 130. Control circuit 130 receives test enable signal TE, write signal $\overline{W}$, activation signal $\phi_S$ and equalize signal $\phi_{EQ}$ to generate sense amplifier circuit activation signal $\phi_S'$, restore circuit activation signal $\overline{\phi_S}'$ and equalize signal $\phi_{EQ}'$. With activation signals $\phi_S'$, $\overline{\phi_S}'$ and equalize signal $\phi_{EQ}'$, activation-/inactivation of the sense amplifier circuit SE and the restored circuit RS, and equalization of the bit line potential are controlled.

Figure 38:
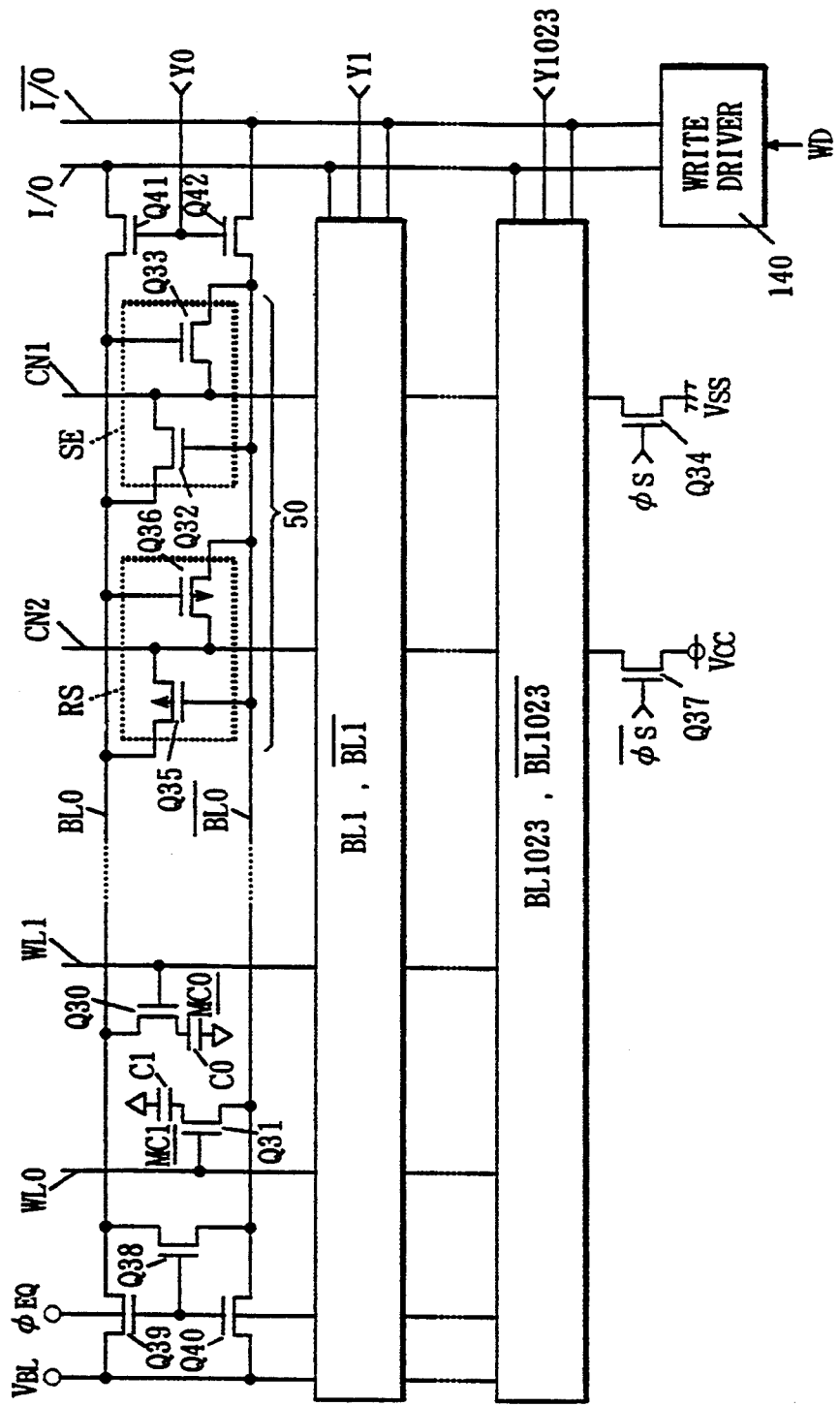
FIG. 38 is a circuit diagram showing a structure of the main components of a conventional DRAM.

Test enable signal TE serves to specify a normal operation or a line mode test operation, and is equivalent to the test enable signal $\overline{\phi}$ in the embodiment of FIG. 1. Write signal $\overline{W}$ serves to specify a write or read operation. The other structures are similar to those shown in FIG. 38.

Figure 35:
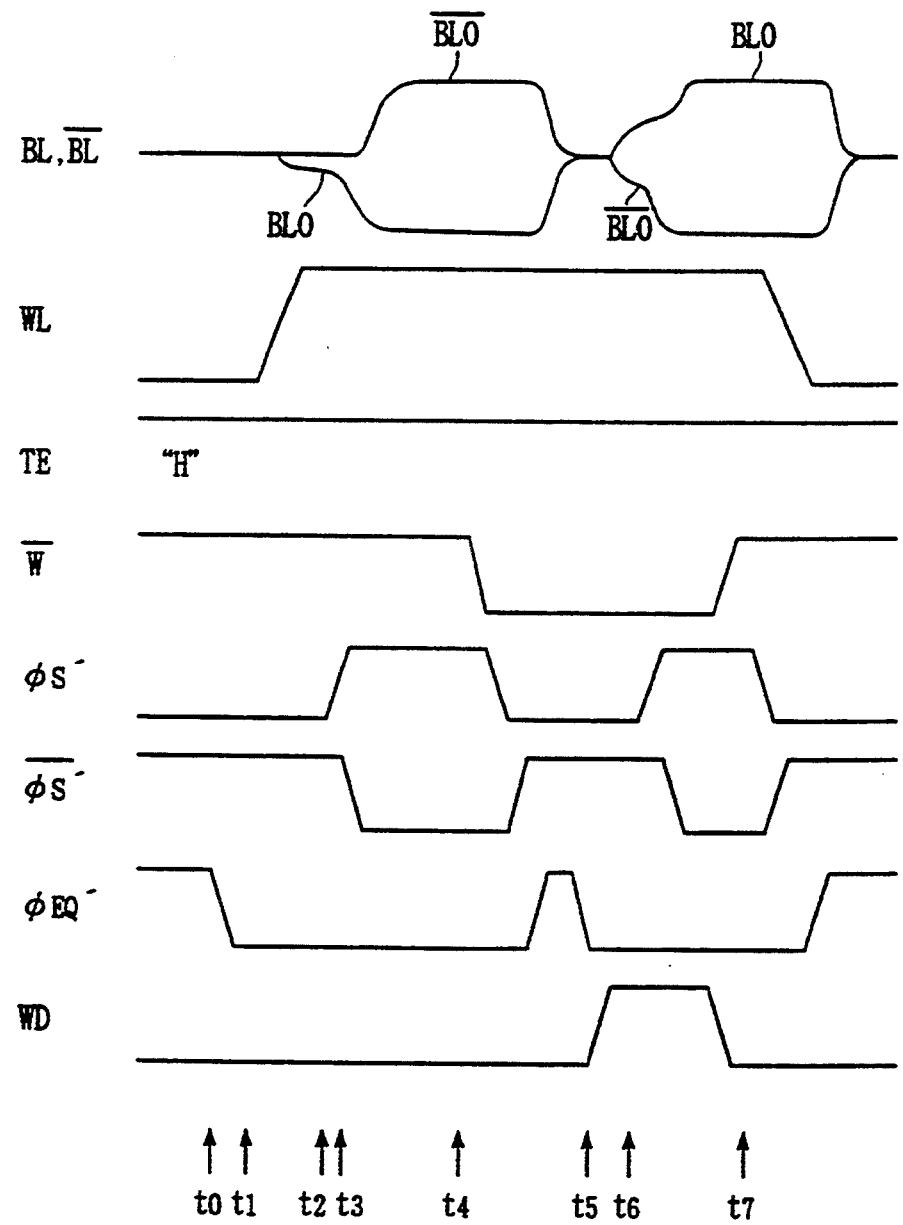
FIG. 35 is a waveform chart showing the writing operation of line mode testing of the DRAM of FIG. 34.

Writing operation of line mode testing of the DRAM of FIG. 34 is described with reference to the waveform chart of FIG. 35.

Line mode testing is carried out under the condition that test enable signal TE is at a H level. Before time t0, equalize signal $\phi_{EQ}'$ is at a H level. Bit lines BL0, $\overline{BL0}$ are therefore precharged to the precharge potential $V_{BL}$. At time t0, equalize signal $\phi_{EQ}'$ attains a L level. This ends precharging of the bit line.

At time t1, the potential of word line WL0 rises. This causes data stored in memory cell MC0 to be read out to bit line BL0. Assuming that data of L is written into memory cell MC0, the potential of bit line BL0 becomes lower than that of bit line $\overline{BL0}$. When activation signal $\phi_S'$ attains a H level at time t2, sense amplifier circuit SE is activated. This brings the potential of bit line BL0 to the ground potential. When activation signal $\overline{\phi_S}'$ attains a L level at time t3, restore circuit RS is activated. This brings the potential of bit line $\overline{BL0}$ to the supply voltage $V_{CC}$. The operation up to this point is similar to that of the DRAM of FIG. 38.

At time t4, write signal $\overline{W}$ indicating the writing timing falls down. This fall triggers activation signal $\phi_S'$ to a L level, and the activation signal $\overline{\phi_S}'$ to a H level. Accordingly, sense amplifier circuit SE and restore circuit RS become inactive. Next, equalize signal $\phi_{EQ}'$ attains a H level, and then falls to L again. This equalizes bit line pair BL0 and $\overline{BL0}$ to $(\frac{1}{2}) \cdot V_{CC}$.

At time t5, write driver 140 is activated by activation signal WD. This causes write data of H and L to be applied to input/output lines I/O and $\overline{I/O}$, respectively. As a result, potentials of bit lines BL0 and $\overline{BL0}$ are brought to a H level and a L level, respectively.

At time t6, activation signal $\phi_S'$ attains a H level again, and activation signal $\overline{\phi_S}'$ attains a L level. This activates sense amplifier circuit SE and restore circuit RS, whereby data of H is written in memory cell MC0.

At time t7, activation signal $\phi_S'$ attains a L level, and activation signal $\overline{\phi_S}'$ attains a H level. This causes sense amplifier circuit SE and restore circuit RS to be inactive. Then, equalize signal $\phi_{EQ}'$ attains a H level to equalize the potentials of bit lines BL0 and $\overline{BL0}$.

The above operation is carried out for 1024 pairs of bit line pairs BL0, $\overline{BL0}$–BL1023, $\overline{BL1023}$, whereby data in 1024 memory cells of MC0, MC2, . . . , MC2046 connected to word line WL0 are overwritten simultaneously.

Although data of 1024 bit line pairs are overwritten simultaneously at the time of writing operation of line mode testing in the present embodiment, load of write driver 140 can be alleviated due to sense amplifier circuit SE and restore circuit RS becoming inactive before data writing operation.

The bit line pair is equalized to $(\frac{1}{2}) \cdot V_{CC}$ after sense amplifier circuit SE and restore circuit RS become inactivated. After data writing operation, sense amplifier circuit SE and restore circuit RS are activated to amplify the potential difference of the bit lines. It is therefore possible to perform writing just by supplying a small potential difference to the bit line pair. A write driver having a large current-handling capability is not necessary even if line mode test function is incorporated.

Figure 39:
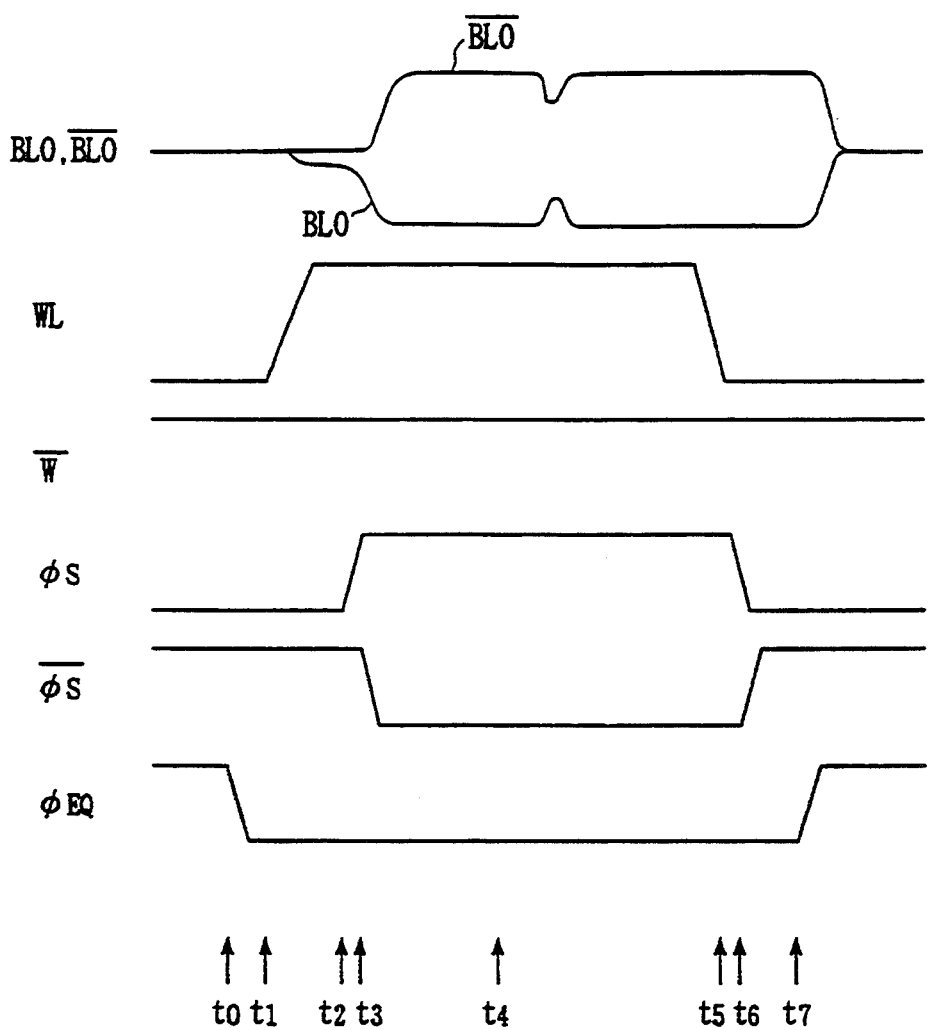
FIG. 39 is a waveform chart showing the read out operation of the DRAM of FIG. 38.
Figure 40:
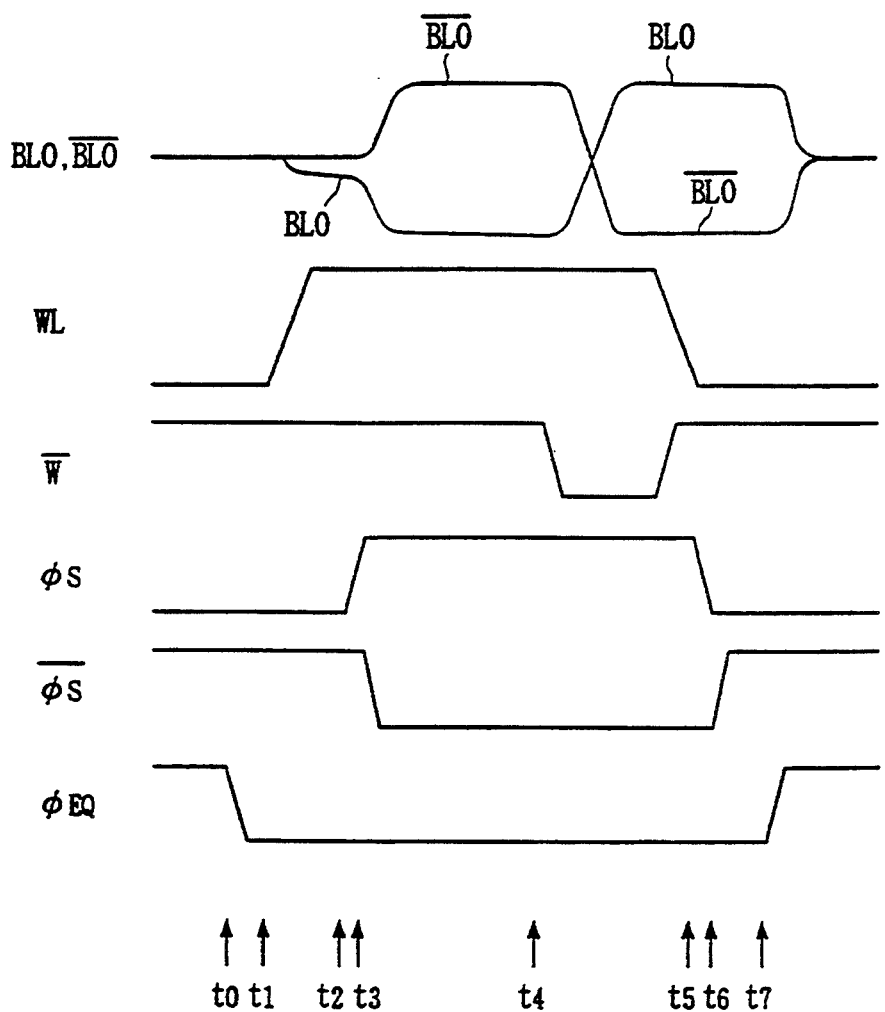
FIG. 40 is a waveform chart showing the writing operation of the DRAM of FIG. 38.
Figure 41:
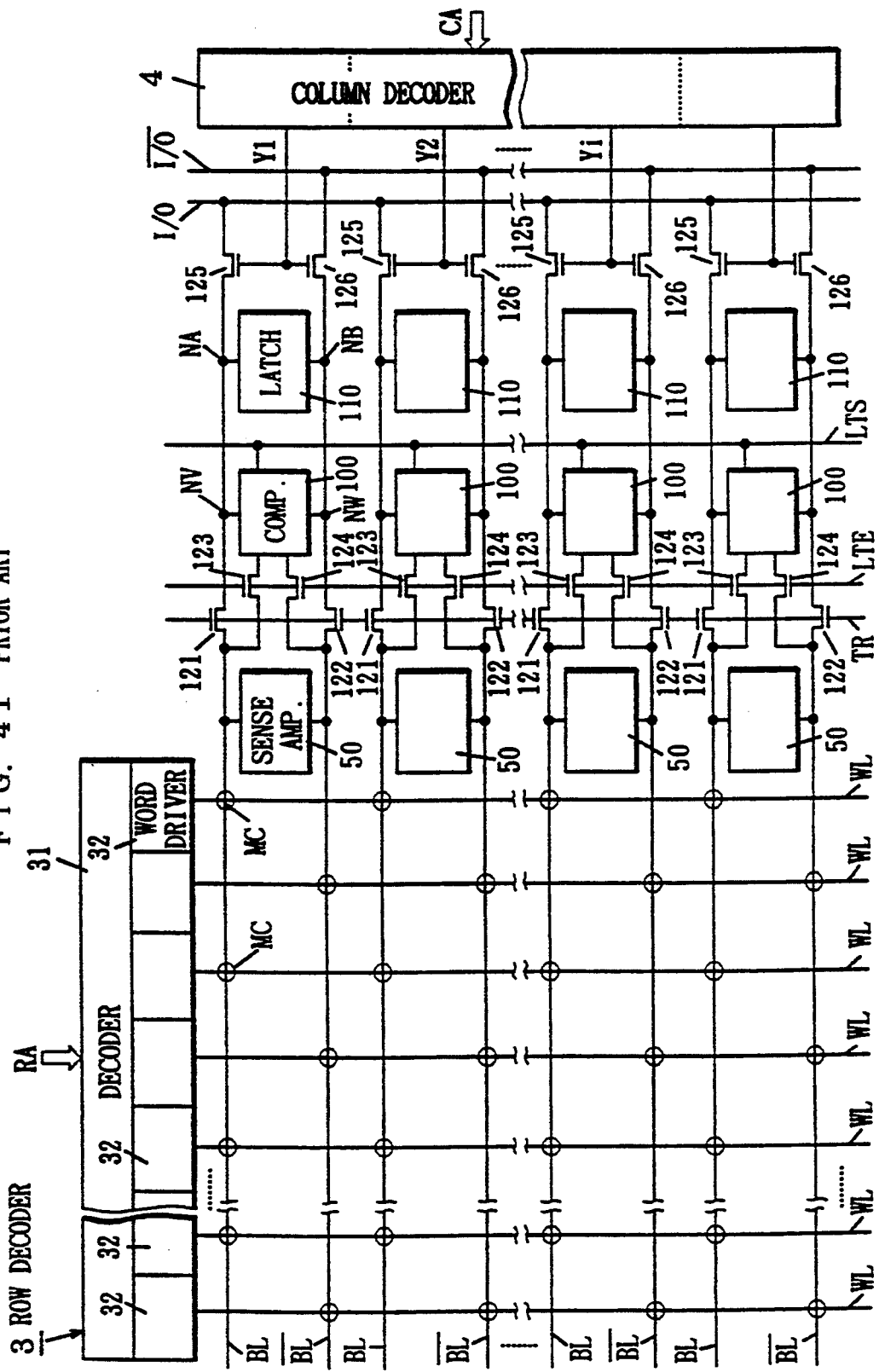
FIG. 41 shows a structure of the main components of a conventional semiconductor memory device having line mode test function.
Figure 42:
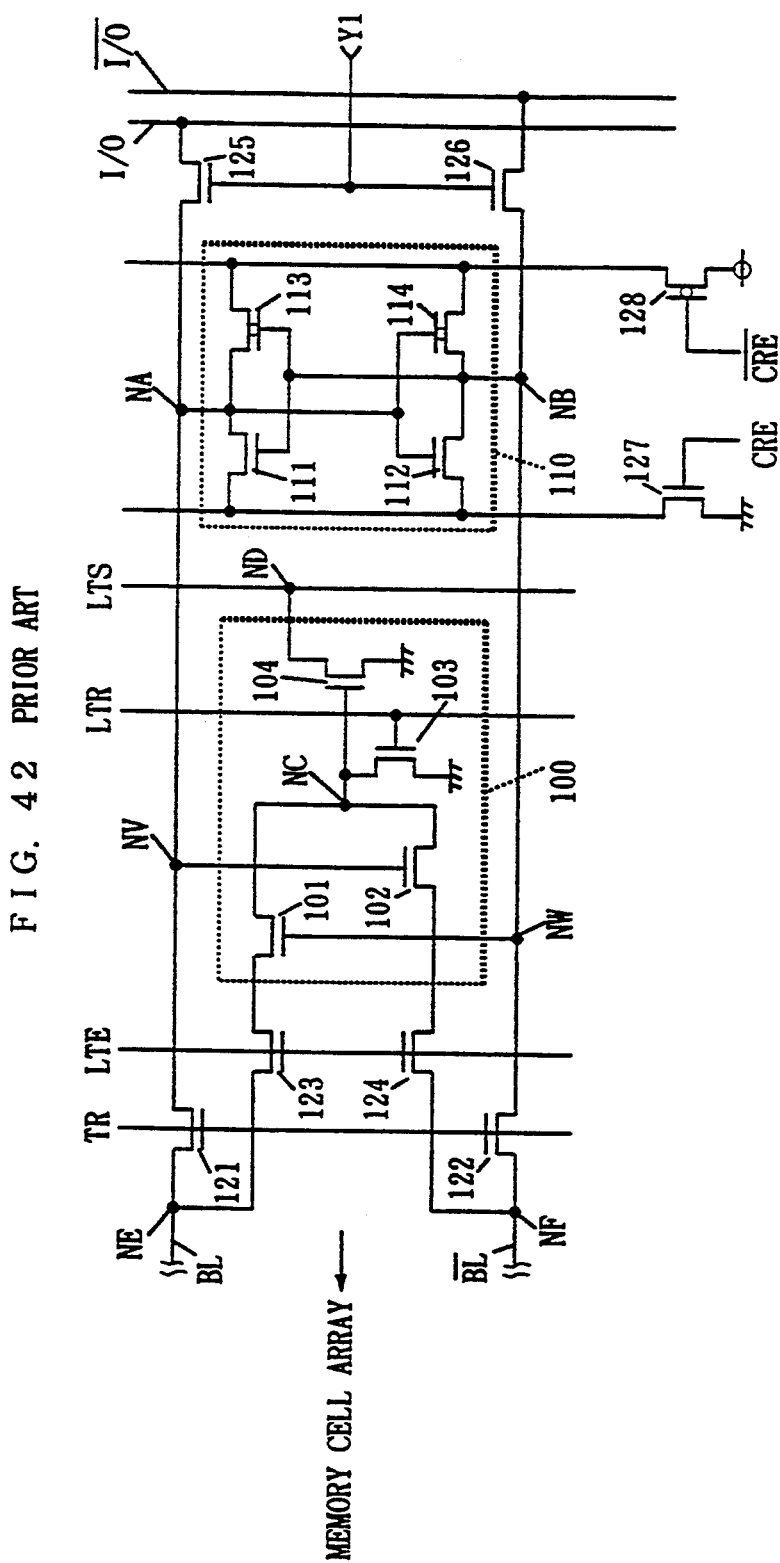
FIG. 42 is a circuit diagram showing the structures of a latch circuit and a comparison circuit of the semiconductor memory device of the FIG. 41.

Test enable signal TE is set to the L level at normal read/write operation. The operation in this case is similar to that shown in FIGS. 39 and 40.

Figure 36:
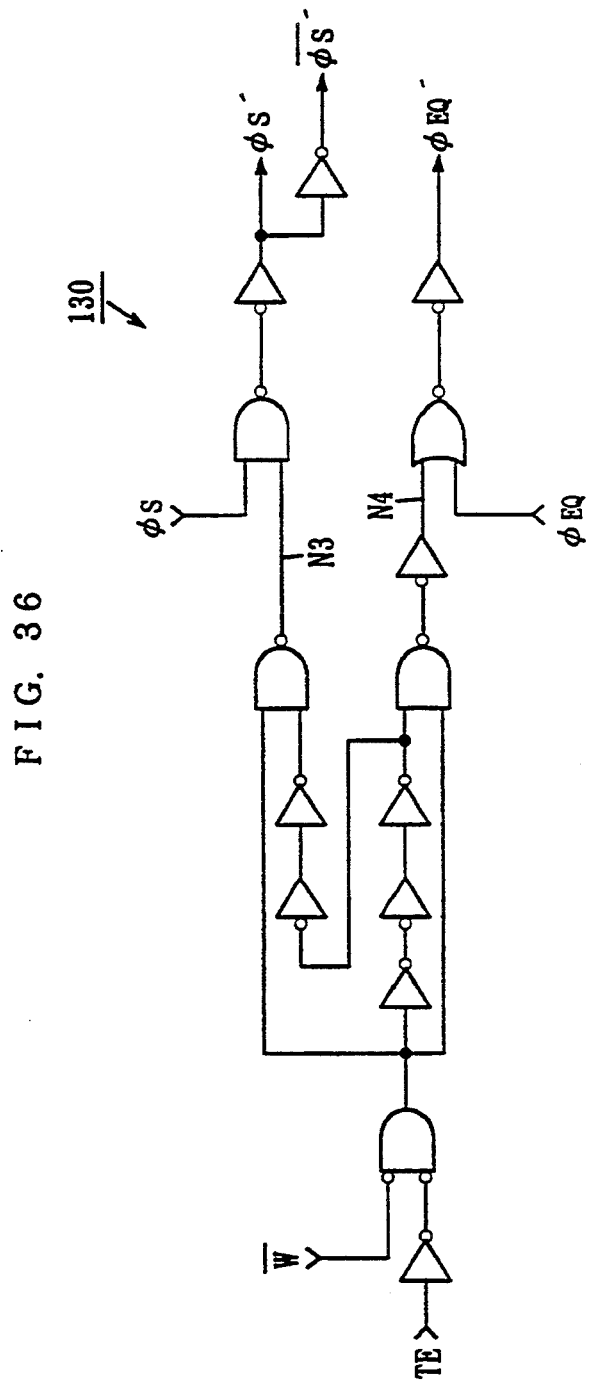
FIG. 36 is a circuit diagram showing an example of a structure of the control circuit of FIG. 34.

FIG. 36 is an example of a structure of the control circuit 130 of FIG. 34. At the time of normal reading-/writing operation (test enable signal TE is at L level), the potential of node N3 is at a H level. Therefore, the logic level of sense amplifier circuit activation circuit $\phi_S'$ is identical to that of activation signal $\phi_S$, and the logic level of restore circuit activation signal $\overline{\phi_S}'$ is opposite to that of activation signal $\phi_S'$. The potential of node N4 is at a L level, and the logic level of equalize signal $\phi_{EQ}'$ is identical to that of equalize signal $\phi_{EQ}$.

At the time of line mode testing, test enable signal TE is at a H level. The drop of write signal $\overline{W}$ triggers node N3 to generate a one shot pulse of L active. The drop of write signal $\overline{W}$ triggers activation signal $\phi_S'$ to become inactivated, and then activated again. Activation signal $\overline{\phi_S}'$ is an inverse signal of activation signal $\phi_S'$. Therefore, the drop of write signal $\overline{W}$ triggers activation signal $\overline{\phi}'$ to become inactivated, and then activated again.

The drop of write signal $\overline{W}$ triggers node N4 to generate a one shot pulse of H active. That is to say, the drop of write signal $\overline{W}$ triggers equalize signal $\phi_{EQ}'$ to become H, and then L again. According to the structure of FIG. 36, the waveforms of FIG. 35 are obtained.

Figure 37:
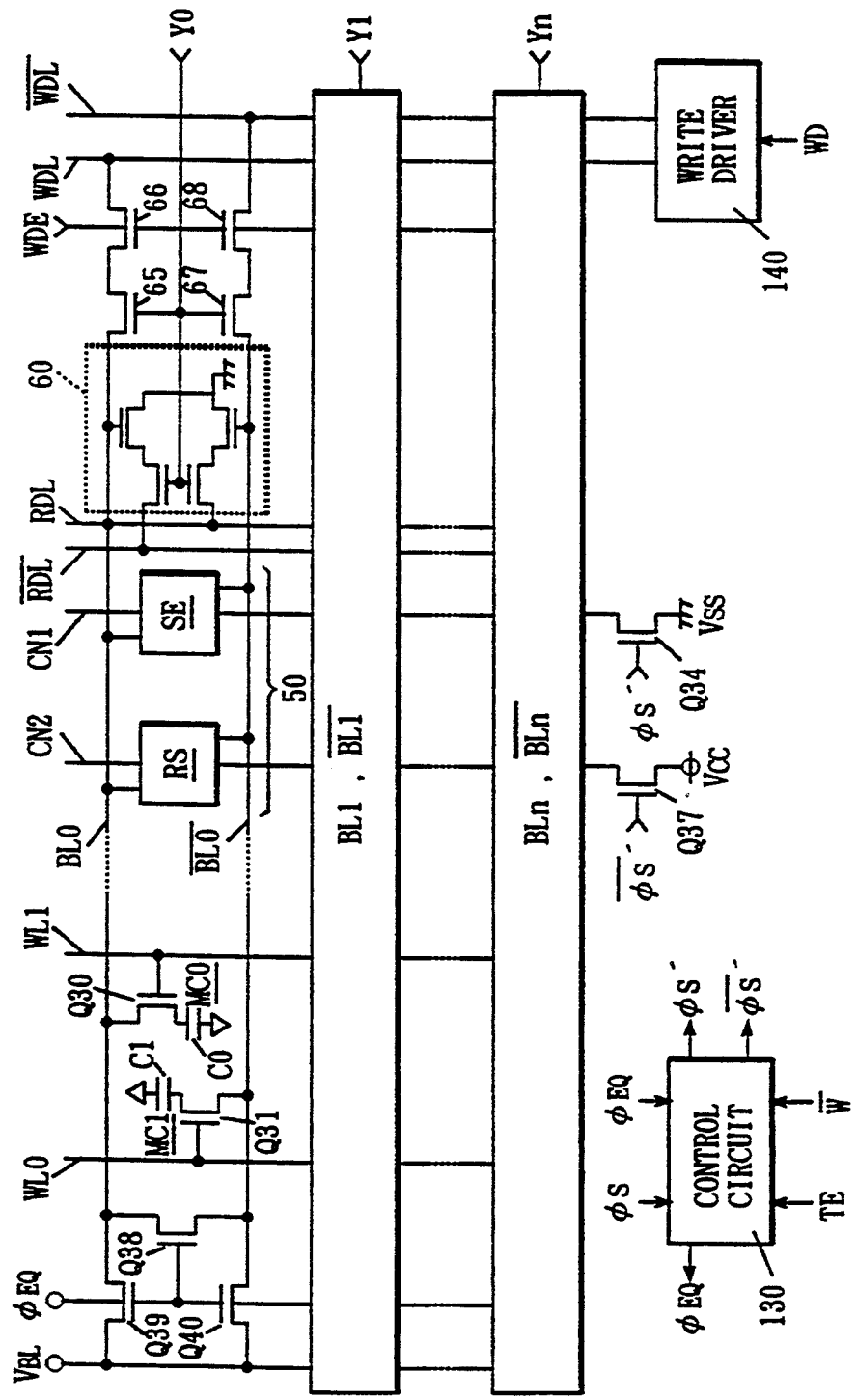
FIG. 37 is a circuit diagram showing a structure of the main components of a DRAM according to a still further embodiment of the present invention.

FIG. 37 is a circuit diagram showing a structure of the main components of a DRAM according to a still further embodiment of the present invention.

Read line pair RDL and $\overline{RDL}$, and write line pair WDL and $\overline{WDL}$ are separated from each other in the present embodiment. Data read out from the memory cell is provided via read line pair RDL, $\overline{\text{RDL}}$. Data to be written into the memory cell is applied via write line pair WDL, $\overline{\text{WDL}}$. The other structures are similar to those of FIG. 34.

The control circuit 130 of FIGS. 34 and 37 may be applied to the semiconductor memory device of FIGS. 2 and 6.

Although bit lines BL0 and $\overline{\text{BL0}}$ are precharged to $(\frac{1}{2}) \cdot V_{CC}$ in the above embodiment, precharge potential $V_{BL}$ may be the supply voltage $V_{CC}$.

Although a line mode testing where data writing is carried out for all the memory cells connected to one word line is described in the above embodiment, the present invention is not limited to testing of all memory cells, and may be applied where data writing is carried out simultaneously to a plurality of memory cells.

According to the present invention, a high speed operable semiconductor memory device is obtained that can reduce testing time significantly with minor increase in layout area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory array including a plurality of memory cells arranged in a plurality of rows and columns, said plurality of columns of said memory cell array divided into a plurality of groups in an interleaved manner;
   selecting means for simultaneously selecting all columns in each group in a selected row during testing operation,
   reading means for reading data stored in the memory cells of the selected rows and columns;
   a plurality of test means corresponding respectively to said plurality of groups;
   each of said plurality of test means simultaneously comparing data read out from said selecting columns belonging to the corresponding group with a predetermined expected data value; and
   indicating means for providing a result of said plurality of test means, wherein
   said selecting means comprises means for selecting a single one of said plurality of columns in each group during a normal non-tested operation,
   each of said plurality of test means comprises
      a plurality of first amplifying means corresponding respectively to said plurality of columns,
      second amplifying means, and
      expected data input means for storing an expected data value,
   the first amplifying means corresponding to the column selected by said selecting means and said second amplifying means form a current mirror type amplifier during normal reading operation, and
   each of the first amplifying means corresponding to the columns selected by said selecting means compares data read out from the corresponding column with the expected data value during a testing operation.

2. The semiconductor memory device according to claim 1, further comprising:
   a plurality of write buses corresponding respectively to said plurality of groups,
   a plurality of read buses corresponding respectively to said plurality of group,
   connecting means for connecting a single column selected by said selecting means in each block to the corresponding write bus during normal writing operation, and
   activation means for activating the first amplifying means corresponding to a column selected by said selecting means.

3. The semiconductor memory device according to claim 1, wherein each of said plurality of test means carries out line mode testing.

4. A semiconductor memory device comprising:
   a memory array including a plurality of word lines, a plurality of bit line pairs provided to cross said plurality of word lines, and a plurality of memory cells provided at crossings of said word lines and said bit line pairs said plurality of bit line pairs divided into a plurality of groups in an interleaved manner,
   a plurality of write buses corresponding respectively to said plurality of groups,
   a plurality of read buses corresponding respectively to said plurality of groups,
   a plurality of first amplifying means each provided between each of said plurality of bit line pairs and a corresponding read bus,
   a plurality of second amplifying means corresponding respectively to said plurality of groups,
   a plurality of expected data input means corresponding respectively to said plurality of groups for storing an expected data value,
   selecting means for selecting a single one of said plurality of bit line pairs in each group for reading and writing during normal operation, and for simultaneously selecting all bit line pairs in each group during testing operation,
   connecting means for connecting a bit line pair selected by said selecting means to a corresponding write bus during normal operation, and
   activation means for activating a first amplifying means corresponding to a selected bit line pair,
   wherein the activated first amplifying means and said second amplifying means form a current mirror type amplifier during normal reading operation, and
   wherein each of the activated first amplifying means compares data of the corresponding bit line pair with a corresponding expected data value for providing the comparison result thereof to the corresponding read bus during testing operation.

5. The semiconductor memory device according to claim 4, further comprising
   a plurality of error detection means corresponding respectively to said plurality of groups for providing an error flag in response to a comparison indication received from the corresponding first amplifying means.

6. The semiconductor memory device according to claim 4, wherein each of said plurality of first amplifying means forms a differential amplifier.

7. The semiconductor memory device according to claim 4, wherein said selecting means comprises column decoder means responsive to an externally applied address signal for generating a plurality of selecting signals for simultaneously selecting all bit line pairs in each group during testing operation and for generating a single selecting signal for selecting a bit line pair in each group during normal reading and writing operation.

8. The semiconductor memory device according to claim 4, wherein said test operation comprises a line mode test operation.

9. The semiconductor memory device according to claim 4, further comprising:
a plurality of third amplifying means corresponding respectively to said plurality of bit line pairs for amplifying potential difference on the corresponding bit line pair, and control means for activating said third amplifying means at the time of reading and writing of normal operation, and for inactivating temporarily said third amplifying means and then activating again third amplifying means at the time of writing of test operation.

10. The semiconductor memory device according to claim 9, further comprising:
equalized means for equalizing the potentials of said plurality of bit line pairs during the period when said plurality of amplifying means are inactivated by said control means at the time of writing of test operation.

11. The semiconductor memory device according to claim 4, further comprising:
a plurality of data buses corresponding respectively to said plurality of groups,
a plurality of line test buses corresponding respectively to said plurality of groups, and
a plurality of switch means corresponding respectively to said plurality of groups, wherein each of said plurality of switch means connects a corresponding read bus to a corresponding data bus during normal reading operation and connects a corresponding read bus to a corresponding line test bus during testing operation.

12. The semiconductor memory device according to claim 11, wherein said test operation comprises a line mode test operation.

13. The semiconductor memory device according to claim 11, further comprising
setting means for setting said semiconductor memory device to a normal operation mode or a test operation mode.

14. The semiconductor memory device according to claim 13, wherein said setting means comprises
an external terminal for receiving an external signal, and
detection means for generating a signal for setting said semiconductor memory device to a test mode, when a voltage of a level higher than a normal logic level is applied to said external terminal.

15. The semiconductor memory device according to claim 4, wherein each of said plurality of second amplifying means forms a differential amplifier.

16. The semiconductor memory device according to claim 15, wherein said differential amplifier comprises a symmetric type differential amplifier.

17. The semiconductor memory device according to claim 15, wherein said differential amplifier comprises a double differential amplifier.

18. The semiconductor memory device according to claim 15, wherein said differential amplifier comprises a double symmetric type differential amplifier.

19. A semiconductor memory device comprising:
first and second memory arrays including a plurality of memory cells arranged in a plurality of rows and columns, said plurality of columns of said memory cell array divided into a plurality of groups in an interleaved manner;
switching means for selecting one of said first and second memory arrays;
selecting means for simultaneously selecting all columns in each group in a selected row in the selected memory array during testing operation;
reading means for reading data stored in the memory cells of the selected row and columns;
a plurality of test means corresponding respectively to said plurality of groups;
each of said plurality of test means simultaneously comparing data read out from said selected columns belonging to the corresponding group with a predetermined expected data value; and
indicating means for providing a result of said plurality of test means, wherein
said selecting means comprises means for selecting a single one of said plurality of columns in each group during a normal non-tested operation,
each of said plurality of test means comprises
a plurality of first amplifying means corresponding respectively to said plurality of columns,
second amplifying means, and
expected data input means for storing an expected data value,
the first amplifying means corresponding to the column selected by said selecting means and said second amplifying means form a current mirror type amplifier during normal reading operation, and
each of the first amplifying means corresponding to the columns selected by said selecting means compares data read out from the corresponding column with the expected data value during a testing operation.

* * * * *